(12) United States Patent
Nakamura et al.

(10) Patent No.: US 7,714,319 B2
(45) Date of Patent: May 11, 2010

(54) ORGANIC THIN FILM TRANSISTOR

(75) Inventors: Hiroaki Nakamura, Sodegaura (JP);
Hiroshi Yamamoto, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 10/577,325

(22) PCT Filed: Oct. 27, 2004

(86) PCT No.: PCT/JP2004/016293

§ 371 (c)(1),
(2), (4) Date: Apr. 28, 2006

(87) PCT Pub. No.: WO2005/043630

PCT Pub. Date: May 12, 2005

(65) Prior Publication Data

US 2007/0120111 A1 May 31, 2007

(30) Foreign Application Priority Data

Oct. 31, 2003 (JP) .............................. 2003-372558

(51) Int. Cl.
*H01L 51/30* (2006.01)
*C07D 249/08* (2006.01)
*C07D 403/00* (2006.01)

(52) U.S. Cl. .......... 257/40; 257/E51.024; 257/E51.025; 257/E51.05; 548/258; 548/269.4; 548/302.7; 548/373.1

(58) Field of Classification Search .................... 257/40, 257/E51.001–E51.052; 438/99; 548/258, 548/269.4, 302.7, 373.1
See application file for complete search history.

(56) References Cited

U.S. PATENT DOCUMENTS 6,224,787 B1 * 5/2001 Hanna et al. ............. 252/299.3

(Continued)

FOREIGN PATENT DOCUMENTS

JP 2000-282022 10/2000

(Continued)

OTHER PUBLICATIONS

Klauk, H., et al. "Contact Resistance in Organic Thin Film Transistors." Solid-State Electronics, vol. 47 (2003): pp. 297-301.*

(Continued)

*Primary Examiner*—Matthew W Such
(74) *Attorney, Agent, or Firm*—Oblon, Spivak, McClelland, Maier & Neustadt, L.L.P.

(57) ABSTRACT

A thin film transistor comprising at least three terminals consisting of a gate electrode, a source electrode and a drain electrode; an insulating layer and an organic semiconductor layer on a substrate, which controls its electric current flowing between the source and the drain by applying a electric voltage across the gate electrode, wherein the organic semiconductor layer comprises a heterocyclic compound containing a nitrogen atom formed by condensation between five member rings each having a nitrogen atom at their condensation sites or between a five member ring and a six member ring each having a nitrogen atom at their condensation sites. The transistor became to have a fast response speed (driving speed), and further, achieved a large on/off ratio getting an enhanced performance as a transistor.

45 Claims, 4 Drawing Sheets

Device A

U.S. PATENT DOCUMENTS

| | | | |
|---|---|---|---|
| 6,420,057 B1* | 7/2002 | Ueda et al. | 428/690 |
| 6,429,040 B1* | 8/2002 | Bao et al. | 438/99 |
| 6,720,572 B1* | 4/2004 | Jackson et al. | 257/40 |
| 6,861,664 B2* | 3/2005 | Ong et al. | 257/40 |
| 2003/0015698 A1* | 1/2003 | Baldo et al. | 257/40 |
| 2003/0213952 A1* | 11/2003 | Iechi et al. | 257/40 |
| 2005/0127354 A1* | 6/2005 | Hanna et al. | 257/40 |

FOREIGN PATENT DOCUMENTS

| | | |
|---|---|---|
| JP | 2001357977 A * | 12/2001 |
| JP | 2002-100420 | 4/2002 |
| JP | 2002-231325 | 8/2002 |
| WO | WO 03080732 A1 * | 10/2003 |

OTHER PUBLICATIONS

Babel, A. and Jenekhe, S.A. "High Electron Mobility in Ladder Polymer Field Effect Transistors." J. Am. Chem. Soc., vol. 125 (2003): pp. 13656-13657.*

Tobat P.I. Saragi, et al. "Comparison of Charge-Carrier Transport in Thin Films of Spiro-Linked Compounds and Their Corresponding Parent Compounds" Advanced Functional Materials, vol. 16, pp. 966-974 (2006).

B. K. Crone, et al. "Charge Injection and Transport in Single-Layer Organic Light-Emitting Diodes" Applied Physics Letters, vol. 73, No. 21, pp. 3162-3164, (Nov. 23, 1998).

Hiroshi Kayashima, et al. "Fabrication of p- and n-Type Field-Effect Transistors Using Poly(p-phenylenevinylene) via Water-Soluble Precursor Under High-Gravity Condition" Japanese Journal of Applied Physics, vol. 46, No. 8, pp. L177-L179, (2007).

Jae won Jang, et al. "Transient Electroluminescence Study of Enhanced Recombination Mobility in a Bilayer Organic Light-Emitting Diode" Journal of the Korean Physical Society, vol. 38, No. 1, pp. L1-L3, (Jan. 2001).

Hiroya Tsuji, et al. "Voltage-Induced Infrared Spectra from the Organic Field-Effect Transistor Based on N, N'-Bis(3-Methylphenyl)-N,N'-Diphenyl-1,1'-Biphenyl-4,4'-Diamine (TPD)" Mol. Cryst. Liq. Cryst, vol. 455, pp. 353-359, (2006).

Shigeki Naka, et al. "Carrier Transport Properties of Organic Materials for EL Device Operation" Synthetic Metals, vol. 111, No. 112, pp. 331-333, (2000).

Noriyuki Matsusue, et al. "Charge Carrier Transport in Neat Thin Films of Phosphorescent Iridium Complexes" Japanese Journal of Applied Physics, vol. 44, No. 6A, pp. 3691-3694, (2005).

U.S. Appl. No. 12/332,502, filed Dec. 11, 2008, Nakamura, et al.

Jiangeng Xue, et al., "Organic thin-film transistors based on bis(1,2,5-thiadiazolo)-p-quinobis (1,3-dithiole)", Applied Physics Letters, XP 012029552, vol. 79, No. 22, Nov. 26, 2001, pp. 3714-3716.

U.S. Appl. No. 12/388,119, filed Feb. 18, 2009, Nakamura, et al.

* cited by examiner

Device A

Device B

Device C

Device D

ORGANIC THIN FILM TRANSISTOR

TECHNICAL FIELD

The present invention relates to an organic thin film transistor having an organic semiconductor layer. Particularly, the present invention relates to an organic thin film transistor comprising a compound having high electron mobility and being capable of high-speed operation.

BACKGROUND ART

Thin film transistors (TFT) are broadly used as switching elements for display devices such as liquid crystal display, etc. A cross sectional structure of a typical conventional TFT is shown in FIG. 8. As shown in FIG. 8, TFT comprises a gate electrode and an insulating layer in this order on the substrate, and further, comprises a source electrode and a drain electrode formed above the insulating layer having a predetermined distance between them. Over the insulating layer exposing between the electrodes, a semiconductor layer is formed having partial surfaces of each electrodes. In TFT with such a structure, the semiconductor layer forms a channel region and an electric current flowing between the source electrode and the drain electrode is controlled by a voltage applied to the gate electrode resultantly causing an On-Off operation. A transistor of the type having the above operation is generally called as a field effect transistor (FET). With regard to the FET, two kinds of types, i.e., an n-type FET and a p-type FET are known depending on whether the electric current flows caused by electrons or by holes. Above two kinds of FET are frequently used as a pair being known as complementary metal oxide semiconductor (CMOS), and because employing CMOS realizes a circuit for driving with low power consumption, the FET technology became essential which is incapable of lacking in current integrated circuits.

Conventionally, TFTs were prepared employing amorphous silicon or polycrystalline silicon, however, there were problems that making screens large in display devices or so with the use of TFTs is accompanied by significantly soaring in manufacturing cost because a chemical vapor deposition (CVD) equipment used for preparing TFTs employing the silicon is very expensive. Further, because a film-forming process of the amorphous silicon or the polycrystalline silicon is carried out under an extremely high temperature, causing a limitation in kinds of the material employable as a substrate for TFT, there was the problem that a lightweight polymer film substrate or so is unemployable.

For the purpose of overcoming such a problem, a TFT with the use of an organic substance replacing the amorphous silicon or the polycrystalline silicon is proposed. With regard to the film-forming process for preparing a TFT employing organic substances, a vacuum vapor deposition process or a coating process is well known. Those film-forming processes enable not only to realize making screens large in display devices while suppressing soaring in manufacturing cost but also to relatively reduce a process temperature required for film-forming. Accordingly, a practical use of the TFT employing an organic substance is highly expected because of an advantage in little limitation in a selection of material for a substrate and as a result, a large number of report about TFT employing an organic substance are published. Examples of the report include as follows: F. Ebisawa et al. Journal of Applied Physics, vol. 54, p 3255, 1983; A. Assadi et al. Applied Physics Letter, vol. 53, p 195, 1988; G. Guillaud et al. Chemical Physics Letter, vol. 167, p 503, 1990; X. Peng et al. Applied Physics Letter, vol. 57, p 2013, 1990; G. Horowitz et al. Synthetic Metals, vol. 41-43, p 1127, 1991; S. Miyauchi et al. Synthetic Metals, vol. 41-43, 1991; H. Fuchigami et al. Applied Physics Letter, vol. 63, p 1372, 1993; H. Koezuka et al. Applied Physics Letter, vol. 62, p 1794, 1993; F. Garnier et al. Science, vol. 265, p 1684, 1994; A R. Brown et al. Synthetic Metals, vol. 68, p 65, 1994; A. Dodabalapur et al. Science, vol. 2568, p 270, 1995; T. Sumimoto et al. Synthetic Metals, vol. 86, p 2259, 1997; K. Kudo et al. Thin Solid Films, vol. 331, p 51, 1998; K. Kudo et al. Synthetic Metals, vol. 102, p 900, 1999; K. Kudo et al. Synthetic Metals, vol. 111-112, p 11, 2000; etc.

Further, with regard to the organic substance employable in an organic compound layer of TFT, a multimer such as conjugate polymer or thiophene (disclosed in Japanese Unexamined Patent Application Laid-Open Nos. Hei 8-228034, Hei 8-228035, Hei 9-232589, Hei 10-125924, Hei 10-190001, etc.) metallophthalocyanine compound (disclosed in Japanese Unexamined Patent Application Laid-Open No. 2000-174277, etc.) or condensed aromatic hydrocarbon such as pentacene (disclosed in Japanese Unexamined Patent Application Laid-Open Nos. Hei 5-55568, 2001-94107, etc.) is used singly or as a mixture in combination with another compound each other. However, almost all those organic substances employed for the TFT are materials of p-type FET, and materials of n-type FET are extremely limited, as for the mobility, and to express the performance is small. With regard to the material of n-type FET, for example, Japanese Unexamined Patent Application Laid-Open No. Hei 10-135481 only discloses 1,4,5,8-naphthalenetetracarboxyldiunhydride (NTCDA), 11,11,12,12-tetracyanonaphth-2,6-quinodimethan (TCNNQD), 1,4,5,8-naphthalenetetracarboxyldiimide (NTCDI), etc.; and Japanese Unexamined Patent Application Laid-Open No. Hei 11-251601 only discloses phthalocyanine fluoride.

On the other hand, there is an organic electroluminescence (EL) device as a device similarly using an electronic conduction. However, the organic EL device generally forces to feed electric charges by applying a strong electric field of $10^6$ V/cm or greater across a thickness direction of a ultra-thin film of 100 nm or thinner, whereas it is necessary for the organic TFT to feed charges for several μm or longer with high-speed under an electric field of $10^5$ V/cm or smaller and accordingly, an enhanced electric conductivity becomes necessary for the organic substance itself.

Despite the above circumstances, the conventional compounds in the n-type organic TFT had problems in fast response as transistor because its capability for moving electrons was poor, because a field-effect mobility of electron was small, and because response speed was slow. Further, on/off ratio was also small. The above On-Off ratio is defined as a value obtained by dividing an amount of an electric current flowing between a source and a drain when some gate voltage is applied (On) by an amount of an electric current flowing there when any gate voltage is not applied (Off). A word "On electric current" usually means an amount of a (saturated) electric current at a time when the electric current between the source and the drain saturates while increasing the drain voltage.

DISCLOSURE OF THE INVENTION

In order for overcoming the above problems, an object of the present invention is to provide an organic thin film transistor having a fast response speed (driving speed), and further, with a large on/off ratio.

As a result of intensive researches and studies to achieve the above object by the present inventors, it was found that an employment of a heterocyclic compound containing a nitrogen atom with a specified structure as a material for an organic semiconductor layer in an organic thin film transistor enables to speed up the response speed (driving speed) resultantly completing the present invention.

Namely, the present invention provides a thin film transistor comprising at least three terminals consisting of a gate electrode, a source electrode and a drain electrode; an insulating layer and an organic semiconductor layer on a substrate, which controls its electric current flowing between the source and the drain by applying a electric voltage across the gate electrode, wherein the organic semiconductor layer comprises a heterocyclic compound containing a nitrogen atom formed by condensation between five member rings each having a nitrogen atom at their condensation sites or between a five member ring and a six member ring each having a nitrogen atom at their condensation sites.

PREFERRED EMBODIMENTS TO CARRY OUT THE INVENTION

Figure 1:
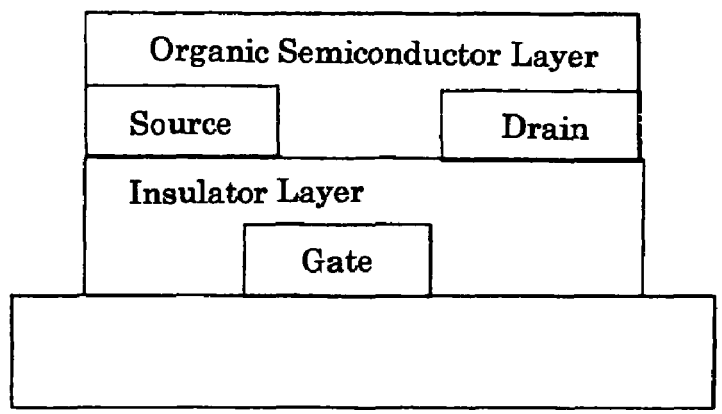
FIG. 1 is a drawing which illustrates one embodiment about device structure of an organic thin film transistor of the present invention.
Figure 2:
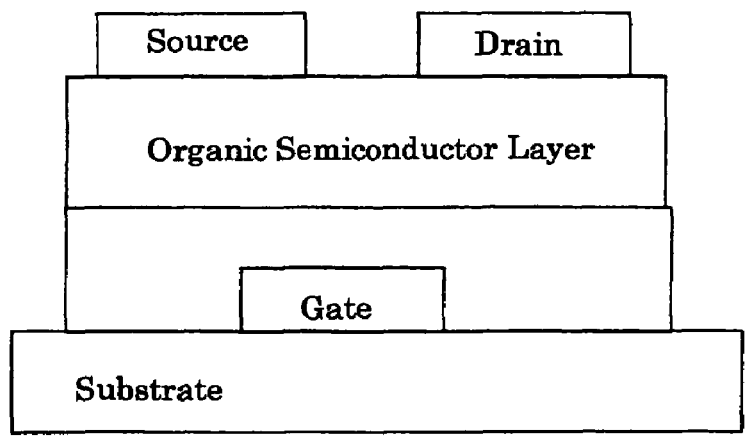
FIG. 2 is a drawing which illustrates another embodiment about device structure of an organic thin film transistor of the present invention.
Figure 3:
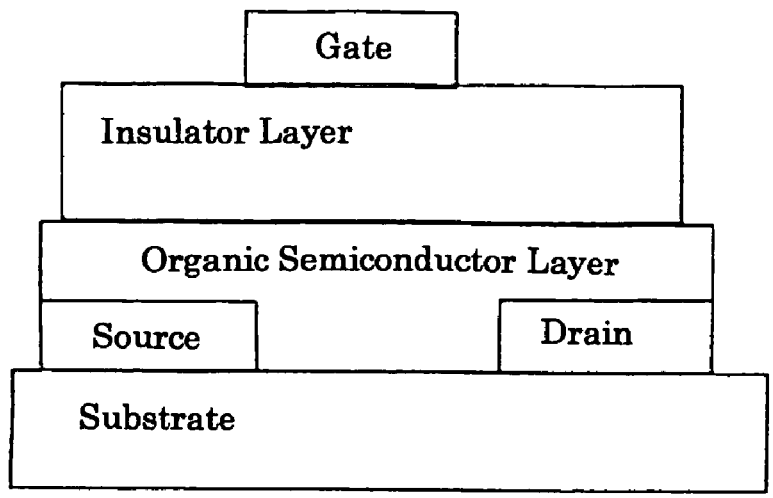
FIG. 3 is a drawing which illustrates another embodiment about device structure of an organic thin film transistor of the present invention.
Figure 4:
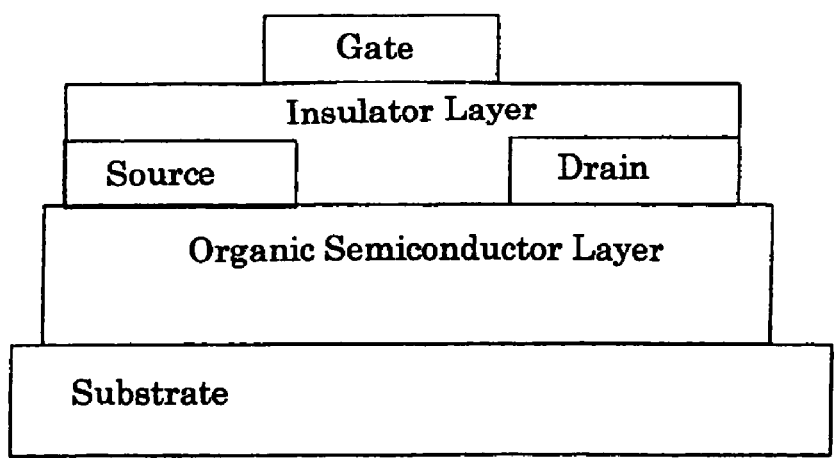
FIG. 4 is a drawing which illustrates another embodiment about device structure of an organic thin film transistor of the present invention.

The present invention provides a thin film transistor comprising at least three terminals consisting of a gate electrode, a source electrode and a drain electrode; an insulating layer and an organic semiconductor layer on a substrate, which controls its electric current flowing between the source and the drain by applying a electric voltage across the gate electrode, wherein the organic semiconductor layer comprises a heterocyclic compound containing a nitrogen atom formed by condensation between five member rings each having a nitrogen atom at their condensation sites or between a five-member ring and a six-member ring each having a nitrogen atom at their condensation sites.

It is preferable that the above heterocyclic compound containing a nitrogen atom is expressed by any one of following general formulae (I) to (VII).

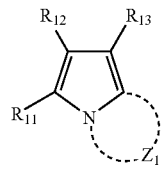
(I)

wherein $R_{11}$, $R_{12}$ and $R_{13}$ each independently represents a hydrogen atom or a substituent; and $Z_1$ represents an atomic group forming a five-member ring or a six-member ring.

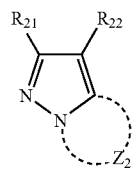
(II)

wherein $R_{21}$ and $R_{22}$ each independently represents a hydrogen atom or a substituent; and $Z_2$ represents an atomic group forming a five-member ring or a six-member ring.

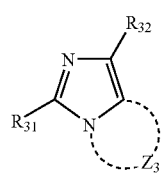
(III)

wherein $R_{31}$ and $R_{32}$ each independently represents a hydrogen atom or a substituent; and $Z_3$ represents an atomic group forming a five-member ring or a six-member ring.

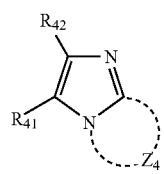
(IV)

wherein $R_{41}$ and $R_{42}$ each independently represents a hydrogen atom or a substituent; and $Z_4$ represents an atomic group forming a five-member ring or a six-member ring.

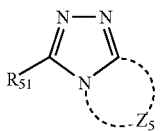

(V)

wherein $R_{51}$ represents a hydrogen atom or a substituent; and $Z_5$ represents an atomic group forming a five-member ring or a six-member ring.

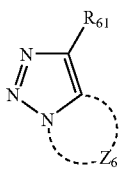

(VI)

wherein $R_{61}$ represents a hydrogen atom or a substituent; and $Z_6$ represents an atomic group forming a five-member ring or a six-member ring.

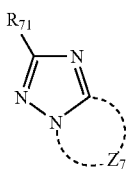

(VII)

wherein $R_{71}$ represents a hydrogen atom or a substituent; and $Z_7$ represents a group forming a five-member ring or a six-member ring.

Although the general formulae (I) to (VII) express canonical formulae, the compounds may be their tautomers.

In the general formulae (I) to (VII), examples of the substituent represented by $R_{11}$, $R_{12}$, $R_{13}$, $R_{21}$, $R_{22}$, $R_{31}$, $R_{41}$, $R_{42}$, $R_{51}$, $R_{61}$ and $R_{71}$ each independently include an alkyl group preferably having 1 to 80 carbon atoms, more preferably having 1 to 40 carbon atoms and further preferably in particular, having 1 to 12 carbon atoms, such as methyl, ethyl, iso-propyl, tert-butyl, n-octyl, n-decyl, n-hexadecyl, cyclopropyl, cyclopentyl, cyclohexyl, etc.; an alkenyl group preferably having 2 to 20 carbon atoms, more preferably having 2 to 12 carbon atoms and further preferably in particular, having 2 to 8 carbon atoms, such as vinyl, aryl, 2-butenyl, 3-pentenyl, etc.; an alkyryl group preferably having 2 to 20 carbon atoms, more preferably having 2 to 12 carbon atoms and further preferably in particular, having 2 to 8 carbon atoms, such as propargyl, 3-pentinyl, etc.; an aryl group preferably having 6 to 80 carbon atoms, more preferably having 6 to 40 carbon atoms and further preferably in particular, having 6 to 12 carbon atoms, such as phenyl, p-methylphenyl, naphthyl, etc.; an amino group preferably having 0 to 40 carbon atoms, more preferably having 0 to 20 carbon atoms and further preferably in particular, having 0 to 6 carbon atoms, such as amino, methylamino, dimethylamino, diethylamino, dibenzylamino, etc.; an alkoxyl group preferably having 1 to 20 carbon atoms, more preferably having 1 to 12 carbon atoms and further preferably in particular, having 1 to 8 carbon atoms, such as methoxy, ethoxy, butoxy, etc.; an aryloxy group preferably having 6 to 20 carbon atoms, more preferably having 6 to 16 carbon atoms and further preferably in particular, having 6 to 12 carbon atoms, such as phenyloxy, 2-naphthyloxy, etc.; an acyl group preferably having 1 to 20 carbon atoms, more preferably having 1 to 16 carbon atoms and further preferably in particular, having 1 to 12 carbon atoms, such as acetyl, benzoyl, formyl, pivaloyl, etc.; an alkoxycarbonyl group preferably having 2 to 20 carbon atoms, more preferably having 2 to 16 carbon atoms and further preferably in particular, having 2 to 12 carbon atoms, such as methoxycarbonyl, ethoxycarbonyl, etc.; an aryloxycarbonyl group preferably having 7 to 20 carbon atoms, more preferably having 7 to 16 carbon atoms and further preferably in particular, having 7 to 10 carbon atoms, such as, for example, phenyloxycarbonyl, etc.; an acyloxy group preferably having 2 to 20 carbon atoms, more preferably having 2 to 16 carbon atoms and further preferably in particular, having 2 to 10 carbon atoms, such as, for example, acetoxy, benzoyloxy, etc.; an acylamino group preferably having 2 to 20 carbon atoms, more preferably having 2 to 16 carbon atoms and further preferably in particular, having 2 to 10 carbon atoms, such as, for example, acetylamino, benzoylamino, etc.; an alkoxycarbonylamino group preferably having 2 to 20 carbon atoms, more preferably having 2 to 16 carbon atoms and further preferably in particular, having 2 to 12 carbon atoms, such as, for example, methoxycarbonylamino, etc.; an aryloxycarbonylamino group preferably having 7 to 20 carbon atoms, more preferably having 7 to 16 carbon atoms and further preferably in particular, having 7 to 12 carbon atoms, such as, for example, phenyloxycarbonylamino, etc.; as sulfonylamino group preferably having 1 to 20 carbon atoms, more preferably having 1 to 16 carbon atoms and further preferably in particular, having 1 to 12 carbon atoms, such as, for example, methanesulphonyl amino, benzensulphonyl amino, etc.; a sulfamoyl group preferably having 0 to 20 carbon atoms, more preferably having 0 to 16 carbon atoms and further preferably in particular, having 0 to 12 carbon atoms, such as, for example, sulfamoyl, methylsulfamoyl, dimethylsulfamoyl, phenylsulfamoyl, etc.; a carbamoyl group preferably having 1 to 20 carbon atoms, more preferably having 1 to 16 carbon atoms and further preferably in particular, having 1 to 12 carbon atoms, such as, for example, carbamoyl, methylcarbamoyl, diethylcarbamoyl, phenylcarbamoyl, etc.; an alkylthio group preferably having 1 to 20 carbon atoms, more preferably having 1 to 16 carbon atoms and further preferably in particular, having 1 to 12 carbon atoms, such as, for example, methylthio, ethylthio, etc.; an arylthio group preferably having 6 to 20 carbon atoms, more preferably having 6 to 16 carbon atoms and further preferably in particular, having 6 to 12 carbon atoms, such as, for example, phenylthio, etc.; a sulphonyl group preferably having 1 to 20 carbon atoms, more preferably having 1 to 16 carbon atoms and further preferably in particular, having 1 to 12 carbon atoms, such as, for example, mesyl, tosyl, etc.; a sulfinyl group preferably having 1 to 20 carbon atoms, more preferably having 1 to 16 carbon atoms and further preferably in particular, having 1 to 12 carbon atoms, such as, for example, methanesulfinyl, benzenesulfinyl, etc.; an ureide group preferably having 1 to 20 carbon atoms, more preferably having 1 to 16 carbon atoms and further preferably in particular, having 1 to 12 carbon atoms, such as, for example, ureide, methylureide, phenylureide, etc.; a phosphoric amide group preferably having 1 to 20 carbon atoms, more preferably having 1 to 16 carbon atoms and further preferably in particular, having 1 to 12 carbon atoms, such as, for example, diethylphosphoric amide, phenylphosphate amide, etc.; a hydroxy group; a mercapto group; a halogen atom such as, for example, fluorine atom, chlorine atom, bromine atom and iodine atom; a cyano group; a sulfo group; a carboxyl group; a nitro group; a hydroxamic acid group; a surufino group; a hydrazino group; an imino group; and a heterocycle group preferably having 1 to 20 carbon atoms, more preferably having 1 to 12 carbon atoms; whose hetero atoms include, for example, nitrogen atom, oxygen atom and sulfur atom; specific examples include imidazolyl, pyridyl, quinolyl, furyl, piperidyl, morpholino, benzoxazolyl, benzimidazolyl, benzthiazolyl, etc. Those substituents may be further substituted. Furthermore, when there are two or more substituents, the substituents may be the same with or different from each other. Moreover, in a case where it is possible, they may connect to form a ring.

Preferable examples of the substituent include alkyl group, alkenyl group, aralkyl group, aryl group, acyl group, alkoxyl group, aryloxy group, acyloxy group, alkoxycarbonyl group, aryloxycarbonyl group, carbonylamino group, sulfonyl amino group, sulfamoyl group, carbamoyl group, cyano group, halogen atom, hydroxy group and heterocyclic group; more preferable examples of the substituent include alkyl group, alkenyl group, aralkyl group, aryl group, acyl group, alkoxycarbonyl group, carbonylamino group, sulfonylamino group, cyano group, halogen atom and aromatic heterocyclic group; and further more preferable examples of the substituent include alkyl group, alkenyl group, aryl group, alkoxycarbonyl group, cyano group and aromatic azole group.

Examples of the atomic group forming a five-member ring or a six-member ring represented by $Z_1$ in the general formula (I) include pyrrole, pyrazole, imidazole, triazole, thiazole, thiadiazole, oxazole, oxadiazole, triazine, pyrimidine, pyridine, pyrazine, pyridazine, etc.; preferably imidazole, triazole, triazine and pyrimidine; more preferably imidazole, triazole and triazine; further more preferably triazole.

Examples of the atomic group forming a five-member ring or a six-member ring represented by $Z_2$ in the general formula (II) include pyrrole, pyrazole, imidazole, triazole, thiazole, thiadiazole, oxazole, oxadizole, triazine, pyrimidine, pyridine, pyrazine, pyridazine, etc.; preferably include imidazole, triazole, triazine and pyrimidine; more preferably imidazole, triazole and triazine; further more preferably imidazole and triazole.

Examples of the atomic group forming a five-member ring or a six-member ring represented by $Z_3$ in the general formula (III) include pyrrole, pyrazole, imidazole, triazole, thiazole, thiadiazole, oxazole, oxadiazole, triazine, pyrimidine, pyridine, pyrazine, pyridazine, etc.; preferably pyrrole, pyrazole, imidazole and triazole; more preferably pyrrole, pyrazole and triazole; further more preferably pyrrole and pyrazole.

Examples of the atomic group forming a five-member ring or a six-member ring represented by $Z_4$ in the general formula (IV) include pyrrole, pyrazole, imidazole, triazole, thiazole, thiadiazole, oxazole, oxadiazole, triazine, pyrimidine, pyridine, pyrazine, pyridazine, etc.; preferably pyrrole, pyrazole, imidazole and triazole; more preferably pyrrole, pyrazole, triazole, triazine, pyrimidine, pyridine, pyrazine and pyridazine; further more preferably pyridine, pyrrole, pyrazine and pyrazole.

Examples of the atomic group forming a five-member ring or a six-member ring represented by $Z_5$ in the general formula (V) include pyrrole, pyrazole, imidazole, thiazole, oxazole, triazine, pyrimidine, pyridine, pyrazine, pyridazine, etc.; preferably pyrrole, pyrazole, imidazole, pyrimidine, pyrazine and pyridazine; more preferably pyrrole, pyrazole, pyrimidine and pyridazine; further more preferably pyrrole and pyrazole.

Examples of the atomic group forming a five-member ring or a six-member ring represented by $Z_6$ in the general formula (VI) include pyrrole, imidazole, thiazole, oxazole, pyrimidine, pyridine, pyrazine, pyridazine, etc.; preferably pyrrole, imidazole, pyrimidine, pyrazine and pyridazine; more preferably pyrrole, pyrimidine, pyrazine and pyridazine; further more preferably pyrrole and pyrimidine.

Examples of the atomic group forming a five-member ring or a six-member ring represented by $Z_7$ in the general formula (VII) include pyrrole, imidazole, thiazole, oxazole, pyrimidine, pyridine, pyrazine, pyridazine, etc.; preferably pyrrole, imidazole, pyrimidine, pyrazine and pyridazine; more preferably pyrrole, pyrimidine, pyrazine and pyridazine; further more preferably pyrrole and pyrimidine.

The five-member ring or the six-member ring formed with $Z_1$ to $Z_7$ may have a substituent, and examples of the substituent are the same as explained about the foregoing $R_{11}$, $R_{12}$, $R_{13}$, $R_{21}$, $R_{22}$, $R_{31}$, $R_{32}$, $R_{41}$, $R_{42}$, $R_{15}$, $R_{61}$ and $R_{71}$; including preferable examples of the substituent.

It is preferable that the compound represented by the general formula (I) of the present invention is shown by following general formulae (I-a) to (I-f) and more preferably, shown by the general formulae (I-a) to (I-c).

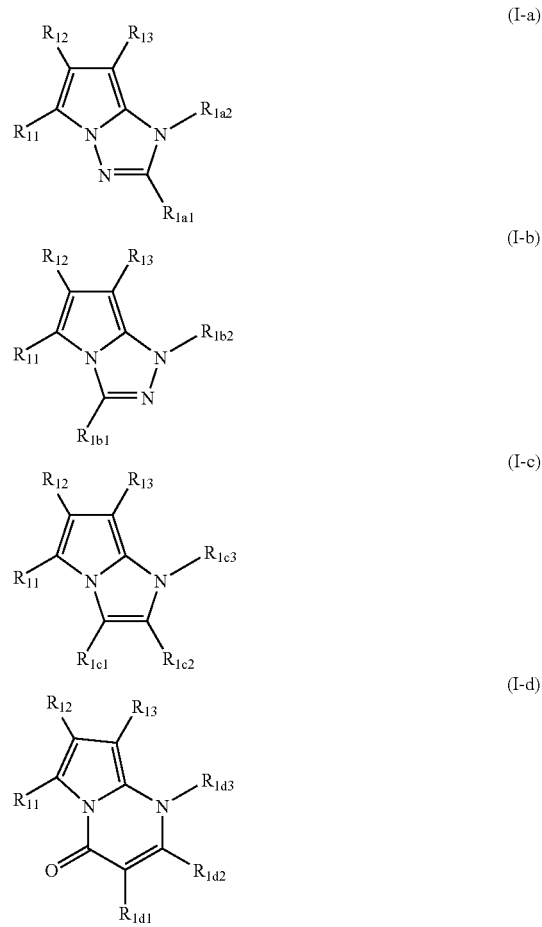

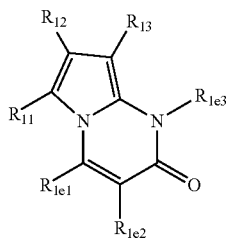

(I-e)

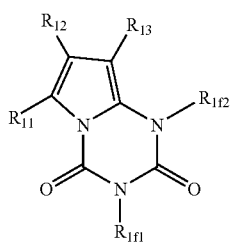

(I-f)

In the general formulae (I-a) to (I-f), $R_{11}$, $R_{12}$ and $R_{13}$ are the same as the aforementioned including the specific examples and the preferable examples.

In the general formulae (I-a) to (I-f), $R_{1a1}$, $R_{1a2}$, $R_{1b1}$, $R_{1b2}$, $R_{1c1}$, $R_{1c2}$, $R_{1c3}$, $R_{1d1}$, $R_{1d2}$, $R_{1d3}$, $R_{1e1}$, $R_{1e2}$, $R_{1e3}$, $R_{1f1}$ and $R_{1f2}$ each independently represents a hydrogen atom or a substituent.

Examples of the substituent represented by the above $R_{1a1}$, $R_{1b1}$, $R_{1c1}$, $R_{1c2}$, $R_{1d1}$, $R_{1d2}$, $R_{1e1}$ and $R_{1e2}$ each independently are the same as explained about the foregoing $R_{11}$, $R_{12}$ and $R_{13}$ in the general formula (I) including the preferable examples.

Examples of the substituent represented by the above $R_{1a2}$, $R_{1b2}$, $R_{1c3}$, $R_{1d3}$, $R_{1e3}$, $R_{1f1}$ and $R_{1f2}$ each independently include an alkyl group preferably having 1 to 20 carbon atoms, more preferably having 1 to 12 carbon atoms and further preferably in particular, having 1 to 8 carbon atoms, such as, for example, methyl, ethyl, iso-propyl, tert-butyl, n-octyl, n-decyl, n-hexadecyl, cyclopropyl, cyclopentyl, cyclohexyl, etc.; an alkenyl group preferably having 2 to 20 carbon atoms, more preferably having 2 to 12 carbon atoms and further preferably in particular, having 2 to 8 carbon atoms, such as, for example, vinyl, aryl, 2-butenyl, 3-pentenyl, etc.; a alkynyl group preferably having 2 to 20 carbon atoms, more preferably having 2 to 12 carbon atoms and further preferably in particular, having 2 to 8 carbon atoms, such as, for example, propargyl, 3-pentynyl, etc.; an aryl group preferably having 6 to 30 carbon atoms, more preferably having 6 to 20 carbon atoms and further preferably in particular, having 6 to 12 carbon atoms, such as, for example, phenyl, p-methylphenyl, naphthyl, etc; an acyl group preferably having 1 to 20 carbon atoms, more preferably having 1 to 16 carbon atoms and further preferably in particular, having 1 to 12 carbon atoms, such as, for example, an acetyl, benzoyl, formyl, pivaloyl, etc.; an alkoxycarbonyl group preferably having 2 to 20 carbon atoms, more preferably having 2 to 16 carbon atoms and further preferably in particular, having 2 to 12 carbon atoms, such as, for example, methoxycarbonyl, ethoxycarbonyl, etc.; an aryloxy carbonyl group preferably having 7 to 20 carbon atoms, more preferably having 7 to 16 carbon atoms and further preferably in particular, having 7 to 10 carbon atoms, such as, for example, phenyloxycarbonyl, etc.; a sulfamoyl group preferably having 0 to 20 carbon atoms, more preferably having 0 to 16 carbon atoms and further preferably in particular, having 0 to 12 carbon atoms, such as, for example, sulfamoyl, methylsulfamoyl, dimethylsulfamoyl, phenylsulfamoyl, etc.; a carbamoyl group preferably having 1 to 20 carbon atoms, more preferably having 1 to 16 carbon atoms and further preferably in particular, having 1 to 12 carbon atoms, such as, for example, carbamoyl, methylcarbamoyl, diethylcarbamoyl, phenylcarbamoyl, etc.; a sulphonyl group preferably having 1 to 20 carbon atoms, more preferably having 1 to 16 carbon atoms and further preferably in particular, having 1 to 12 carbon atoms, such as, for example, mesyl, tosyl, etc.; a sulfinyl group preferably having 1 to 20 carbon atoms, more preferably having 1 to 16 carbon atoms and further preferably in particular, having 1 to 12 carbon atoms, such as, for example, methanesulfinyl, benzenesulfinyl, etc.; a heterocyclic group preferably having 1 to 20 carbon atoms, more preferably having 1 to 12 carbon atoms; whose hetero atoms include, for example, nitrogen atom, oxygen atom and sulfur atom; specific examples include imidazolyl, pyridyl, quinolyl, furyl, piperidyl, morpholino, benzoxazolyl, benzimidazolyl, benzthiazolyl, etc. Among those, the alkyl group, the alkenyl group, the aralkyl group, the aryl group, the acyl group and the heterocyclic group are preferable and the alkyl group, the aryl group and the aromatic heterocyclic group are more preferable.

The foregoing $R_{1a1}$, $R_{1b1}$, $R_{1c1}$, $R_{1c2}$, $R_{1d1}$, $R_{1d2}$, $R_{1e1}$ and $R_{1e2}$ are preferably hydrogen atom, alkyl group, alkenyl group, aryl group, alkoxycarbonyl group, cyano group and aromatic heterocyclic group.

The foregoing $R_{1a2}$, $R_{1b2}$, $R_{1c3}$, $R_{1d3}$, $R_{1e3}$, $R_{1f1}$ and $R_{1f2}$ are preferably hydrogen atom, alkyl group, aryl group and aromatic heterocyclic group.

It is preferable that the compound represented by the general formula (II) is shown by any one of following general formulae (II-a) to (II-f) and more preferably, shown by any one of the general formulae (II-a) to (II-c).

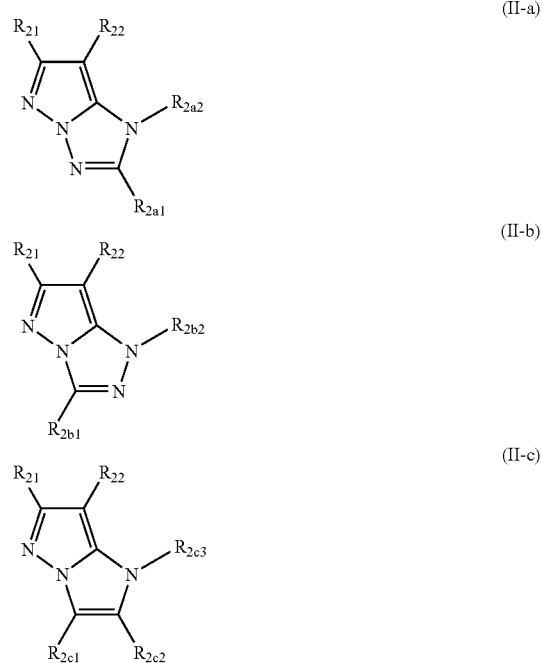

-continued

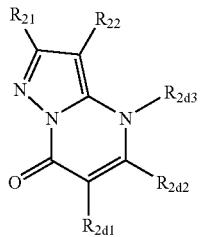
(II-d)

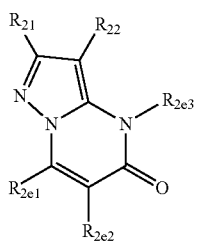
(II-e)

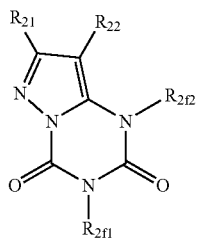
(II-f)

In the general formulae (II-a) to (II-f), $R_{21}$ and $R_{22}$ are the same as the aforementioned including the specific examples and the preferable examples.

In the general formulae (II-a) to (II-f), $R_{2a1}$, $R_{2a2}$, $R_{2b1}$, $R_{2b2}$, $R_{2c1}$, $R_{2c2}$, $R_{2c3}$, $R_{2d1}$, $R_{2d2}$, $R_{2d3}$, $R_{2e1}$, $R_{2e2}$, $R_{2e3}$, $R_{2f1}$ and $R_{2f2}$ each independently represents a hydrogen atom or a substituent.

Examples of the substituent represented by the above $R_{2a1}$, $R_{2b1}$, $R_{2c1}$, $R_{2c2}$, $R_{2d1}$, $R_{2d2}$, $R_{2e1}$ and $R_{2e2}$ each independently are the same as explained about the foregoing $R_{11}$ in the general formula (I) including the preferable examples.

Examples of the substituent represented by the above $R_{2a2}$, $R_{2b2}$, $R_{2c3}$, $R_{2d3}$, $R_{2e3}$, $R_{2f1}$ and $R_{2f2}$ each independently are the same as explained about the foregoing $R_{1a2}$ in the general formula (I-a) including the preferable examples.

The above $R_{2a1}$, $R_{2b1}$, $R_{2c1}$, $R_{2c2}$, $R_{2d1}$, $R_{2d2}$, $R_{2e1}$ and $R_{2e2}$ are preferably hydrogen atom, alkyl group, alkenyl group, aryl group, alkoxycarbonyl group, cyano group and aromatic heterocyclic group.

The above $R_{2a2}$, $R_{2b2}$, $R_{2c3}$, $R_{2d3}$, $R_{2e3}$, $R_{2f1}$ and $R_{2f2}$ are preferably hydrogen atom, alkyl group, aryl group and aromatic heterocyclic group.

It is more preferable that the compound represented by the general formula (III) is shown by following general formulae (III-a) to (III-c).

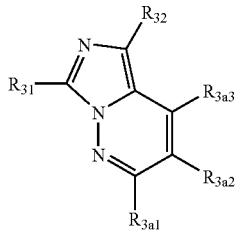
(III-a)

In the general formulae (III-a), $R_{31}$ and $R_{32}$ are the same as the aforementioned including the specific examples and the preferable examples.

In the general formulae (III-a), $R_{3a1}$, $R_{3a2}$ and $R_{3a3}$ each independently represents a hydrogen atom or a substituent.

Examples of the substituent represented by the above $R_{3a1}$, $R_{3a2}$ and $R_{3a3}$ each independently are the same as explained about the foregoing $R_{11}$ in the general formula (I) including the preferable examples.

The above $R_{3a1}$, $R_{3a2}$ and $R_{3a3}$ are preferably hydrogen atom, alkyl group, alkenyl group, aryl group, alkoxycarbonyl group, cyano group and aromatic heterocyclic group.

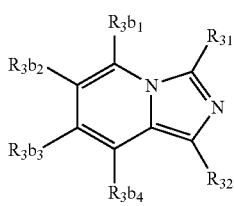
(III-b)

In the general formulae (III-b), $R_{31}$ and $R_{32}$ are the same as the aforementioned including the specific examples and the preferable examples.

In the general formulae (III-b), $R_{3b1}$ to $R_{3a4}$ each independently represents a hydrogen atom or a substituent. Examples of the substituent include alkyl group, cycloalkyl group, aralkyl group, alkenyl group, cycloalkenyl group, alkynyl group, hydroxy group, sulfhydryl group, alkoxyl group, alkylthio group, arylether group, arylthio ether group, aryl group, heterocyclic group, halogen atom, haloalkane residue, haloalkene residue, haloalkine residue, cyano group, aldehyde group, carbonyl group, carboxyl group, ester group, carbamoyl group, amino group, nitro group, silyl group, siloxanyl group, etc.; all of which may form a ring structure with their adjacent substituent.

Further, it is preferable for the general formula (III-b) to be expressed by a following general formula (III-c).

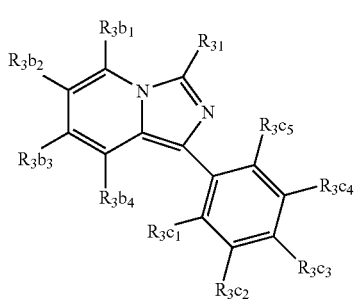
(III-c)

In the general formulae (III-c), $R_{31}$ and $R_{3b1}$ to $R_{3b4}$ are the same as the aforementioned.

In the general formulae (III-c), $R_{3c1}$ to $R_{3c5}$ each independently represents a hydrogen atom or a substituent. Examples of the substituent include alkyl group, cycloalkyl group, aralkyl group, alkenyl group, cycloalkenyl group, alkynyl group, hydroxy group, sulfhydryl group, alkoxyl group, alkylthio group, arylether group, arylthio ether group, aryl group, heterocyclic group, halogen atom, haloalkane residue, haloalkene residue, haloalkine residue, cyano group, aldehyde group, carbonyl group, carboxyl group, ester group, carbamoyl group, amino group, nitro group, silyl group, siloxanyl group, etc.; all of which may form a ring structure with their adjacent substituent.

It is preferable that the compound represented by the general formula (IV) of the present invention is shown by following general formulae to (IV-a) to (IV-g) and more preferably, shown by the general formula (IV-a) or (IV-b).

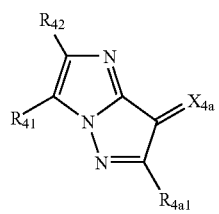
(IV-a)

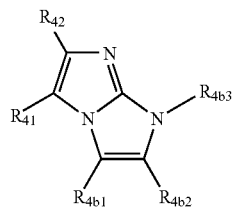
(IV-b)

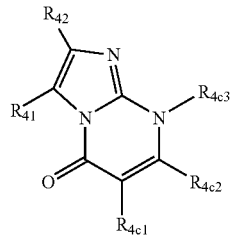
(IV-c)

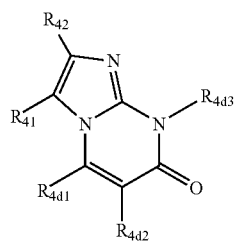
(IV-d)

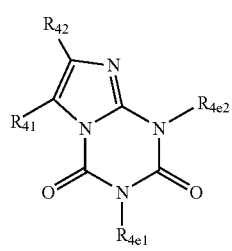
(IV-e)

In the general formulae (IV-a) to (IV-e), $R_{41}$ and $R_{42}$ are the same as the aforementioned including the specific examples and the preferable examples.

In the general formulae (IV-a) to (IV-e), $R_{4a1}$, $R_{4b1}$, $R_{4b2}$, $R_{4b3}$, $R_{4c1}$, $R_{4c2}$, $R_{4c3}$, $R_{4d1}$, $R_{4d2}$, $R_{4d3}$, $R_{4e1}$ and $R_{4e2}$ each independently represents a hydrogen atom or a substituent.

Examples of the substituent represented by the above $R_{4a1}$, $R_{4b1}$, $R_{4c1}$, $R_{4c2}$, $R_{4d1}$ and $R_{4d2}$ each independently are the same as explained about the foregoing $R_{11}$ in the general formula (I) including the preferable examples.

Examples of the substituent represented by the above $R_{4b3}$, $R_{4c3}$, $R_{4d3}$, $R_{4e1}$ and $R_{4e2}$ each independently are the same as explained about the foregoing $R_{1a2}$ in the general formula (I-a) including the preferable examples.

The above $R_{4a1}$, $R_{4b1}$, $R_{4c1}$, $R_{4c2}$, $R_{4d1}$ and $R_{4d2}$ are preferably hydrogen atom, alkyl group, alkenyl group, aryl group, alkoxycarbonyl group, cyano group and aromatic heterocyclic group.

The above $R_{4b3}$, $R_{4c3}$, $R_{4d3}$, $R_{4e1}$ and $R_{4e2}$ are preferably hydrogen atom, alkyl group, aryl group and aromatic heterocyclic group.

In the general formulae (IV-a), $X_{4a}$ is expressed by $CR_{4a2}$ ($R_{4a3}$) or $NR_{4a4}$, wherein $R_{4a2}$ and $R_{4a3}$ each independently represents a hydrogen atom or a substituent; and each substituent independently is the same as explained about $R_{11}$ in the general formula (I) including the preferable examples; $R_{4a4}$ represents a hydrogen atom or a substituent, and the substituent is the same as explained about $R_{1a2}$ in the general formula (I-a) including the preferable examples.

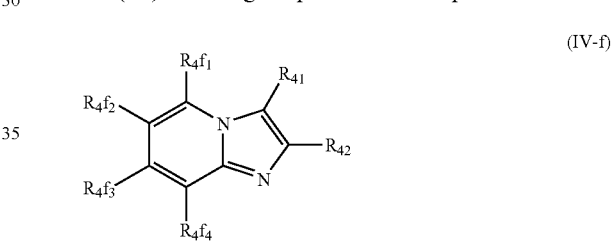
(IV-f)

In the general formula (IV-f), $R_{41}$ and $R_{42}$ are the same as aforementioned including the specific examples and the preferable examples.

In the general formula (IV-f), $R_{4f1}$ to $R_{4f4}$ each independently represents a hydrogen atom or a substituent; examples of the substituent include alkyl group, cycloalkyl group, aralkyl group, alkenyl group, cycloalkenyl group, alkynyl group, hydroxy group, sulfhydryl group, alkoxyl group, alkylthio group, aryl ether group, arylthio ether group, aryl group, heterocyclic group, halogen atom, haloalkane residue, haloalkene residue, haloalkine residue, cyano group, aldehyde group, carbonyl group, carboxyl group, ester group, carbamoyl group, amino group, nitro group, silyl group, siloxanyl group, etc.; all of which may form a ring structure with their adjacent substituent.

Further, it is preferable for the general formula (IV-f) to be expressed by a following general formula (IV-g).

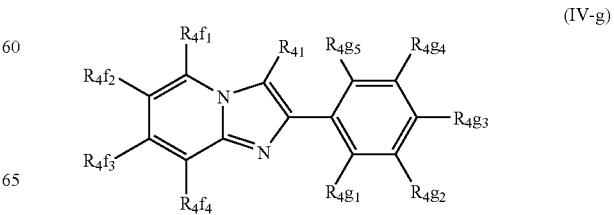
(IV-g)

In the general formula (IV-g), $R_{41}$, $R_{4f1}$ to $R_{4f4}$ are the same as aforementioned.

In the general formula (IV-g), $R_{4g1}$ to $R_{4g5}$ each independently represents a hydrogen atom or a substituent; examples of the substituent include alkyl group, cycloalkyl group, aralkyl group, alkenyl group, cycloalkenyl group, alkynyl group, hydroxy group, sulfhydryl group, alkoxyl group, alkylthio group, aryl ether group, arylthio ether group, aryl group, heterocyclic group, halogen atom, haloalkane residue, haloalkene residue, haloalkine residue, cyano group, aldehyde group, carbonyl group, carboxyl group, ester group, carbamoyl group, amino group, nitro group, silyl group, siloxanyl group, etc.; all of which may form a ring structure with their adjacent substituent.

It is preferable that the compound represented by the general formula (V) is shown by any one of following general formulae (V-a) to (V-e) and more preferably, shown by any one of the general formula (V-a) or (V-b).

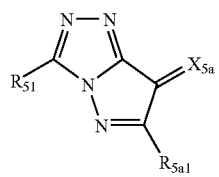
(V-a)

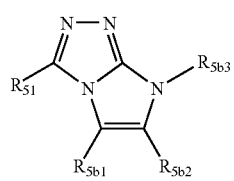
(V-b)

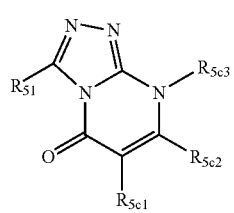
(V-c)

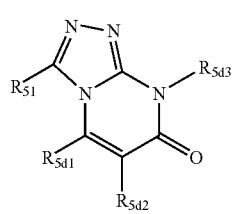
(V-d)

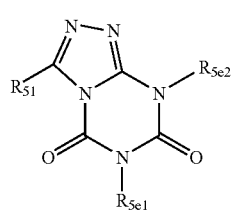
(V-e)

In the general formula (V-a), $R_{51}$ is the same as aforementioned including the specific examples and the preferable examples.

In the general formulae (V-a) to (V-e), $R_{5a1}$, $R_{5b1}$, $R_{5b2}$, $R_{5b3}$, $R_{5c1}$, $R_{5c2}$, $R_{5c3}$, $R_{5d1}$, $R_{5d2}$, $R_{5d3}$, $R_{5e1}$ and $R_{5e2}$ each independently represents a hydrogen atom or a substituent.

Examples of the substituent represented by the above $R_{5a1}$, $R_{5b1}$, $R_{5b2}$, $R_{5c1}$, $R_{5c2}$, $R_{5d1}$ and $R_{5d2}$ each independently are the same as explained about the foregoing $R_{11}$ in the general formula (I) including the preferable examples.

Examples of the substituent represented by the above $R_{5b3}$, $R_{5c3}$, $R_{5d3}$, $R_{5e1}$ and $R_{5e2}$ each independently are the same as explained about the foregoing $R_{1a2}$ in the general formula (I-a) including the preferable examples.

The above $R_{5a1}$, $R_{5b1}$, $R_{5b2}$, $R_{5c1}$, $R_{5c2}$, $R_{5d1}$ and $R_{5d2}$ are preferably hydrogen atom, alkyl group, alkenyl group, aryl group, alkoxycarbonyl group, cyano group and aromatic heterocyclic group.

The above $R_{5b3}$, $R_{5c3}$, $R_{5d3}$, $R_{5e1}$ and $R_{5e2}$ are preferably hydrogen atom, alkyl group, aryl group and aromatic heterocyclic group.

In the general formulae (IV-a), $X_{5a}$ is expressed by $CR_{5a2}$ ($R_{5a3}$) or $NR_{5a4}$, wherein $R_{5a2}$ and $R_{5a3}$ each independently represents a hydrogen atom or a substituent; and each substituent independently is the same as explained about $R_{11}$ in the general formula (I) including the preferable examples; $R_{5a4}$ represents a hydrogen atom or a substituent, and the substituent is the same as explained about $R_{1a2}$ in the general formula (I-a) including the preferable examples.

It is more preferable that the compound represented by the general formula (VI) is shown by a following general formula (VI-a).

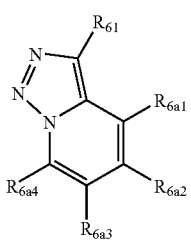
(VI-a)

In the general formula (VI-a), $R_{61}$ is the same as aforementioned including the specific examples and the preferable examples.

In the general formula (VI-a), $R_{6a1}$, $R_{6a2}$, $R_{6a3}$ and $R_{6a4}$ each independently represents a hydrogen atom or a substituent; and each substituent independently is the same as explained about $R_{11}$ in the general formula (I) including the preferable examples.

It is preferable that the compound represented by the general formula (VII) is shown by any one of following general formulae (VII-a) to (VII-d).

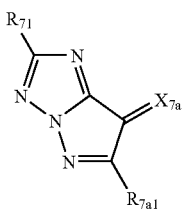
(VII-a)

-continued

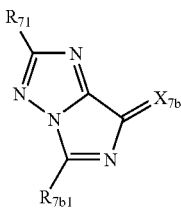
(VII-b)

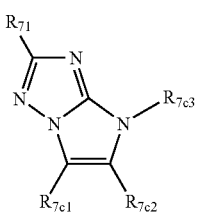
(VII-c)

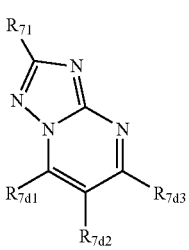
(VII-d)

In the general formula (VII-a), $R_{71}$ is the same as aforementioned including the specific examples and the preferable examples.

In the general formulae (VII-a) to (VII-d), $R_{7a1}$, $R_{7b1}$, $R_{7b2}$, $R_{7c1}$, $R_{7c2}$, $R_{7c3}$, $R_{7d1}$, $R_{7d2}$, and $R_{7d3}$ each independently represents a hydrogen atom or a substituent.

Examples of the substituent represented by the above $R_{7a1}$, $R_{7b1}$, $R_{7b2}$, $R_{7c1}$, $R_{7c2}$, $R_{7d1}$, $R_{7d2}$, and $R_{7d3}$ each independently are the same as explained about the foregoing $R_{11}$ in the general formula (I) including the preferable examples.

Examples of the substituent represented by the above $R_{7c3}$ are the same as explained about the foregoing $R_{1a2}$ in the general formula (I-a) including the preferable examples.

The above $R_{7a1}$, $R_{7b1}$, $R_{7b2}$, $R_{7c1}$, $R_{7c2}$, $R_{7c3}$, $R_{7d1}$, $R_{7d2}$, and $R_{7d3}$ are preferably hydrogen atom, alkyl group, alkenyl group, aryl group, alkoxycarbonyl group, cyano group and aromatic heterocyclic group.

The above $R_{7c3}$ is preferably hydrogen atom, alkyl group, aryl group and aromatic heterocyclic group.

In the general formulae (VII-a), $X_{7a}$ and $X_{7b}$ are each expressed by $CR_{7a2}(R_{7a3})$ or $NR_{7a4}$, wherein $R_{7a2}$ and $R_{7a3}$ each independently represents a hydrogen atom or a substituent; and each substituent independently is the same as explained about $R_{11}$ in the general formula (I) including the preferable examples; $R_{7a4}$ represents a hydrogen atom or a substituent, and the substituent is the same as explained about $R_{1a2}$ in the general formula (I-a) including the preferable examples.

The heterocyclic compound of the present invention may be a low molecular weight compound, may be a high molecular weight compound whose moiety was connected to polymer main chain (having weight average molecular weight of preferably 1000-5000000, more preferably of 5000-2000000 and further more preferably of 10000-1000000), or may be a high molecular weight compound which has a compound of the present invention in main chain (having weight average molecular weight of preferably 1000-5000000, more preferably of 5000-2000000 and further more preferably of 10000-1000000). In a case where the heterocyclic compound is a high molecular weight compound, it may be a homopolymer or may be a copolymer with other monomer. Preferable compound employed in the present invention is a low molecular weight compound.

The compound of the present invention can be synthesized by various kinds of synthesizing processes. Namely, it can be synthesized taking descriptions in, for example, "COMPREHENSIVE HETEROCYCLIC CHEMISTRY" written by ALAN R. KATRITZKY and CHARLES W. REES (PERGAMONPRESS), Japanese Unexamined Patent Application Laid-Open Nos. Hei 4-174204 and Hei 5-313, etc., into consideration as references.

Specific examples of the heterocyclic compound containing a nitrogen atom employed in the present invention are as follows, however, the present invention is not limited to these typical compounds.

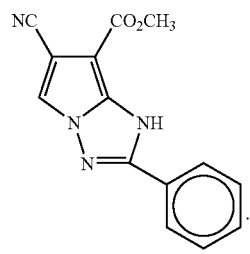
1

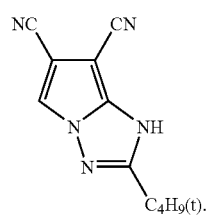
2

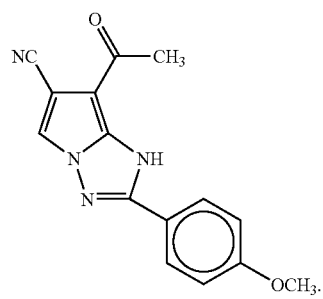
3

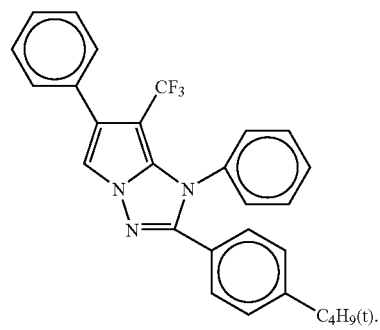
4

-continued
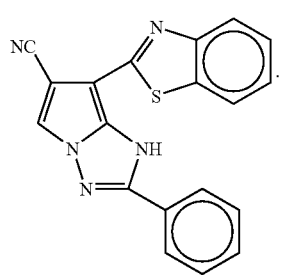
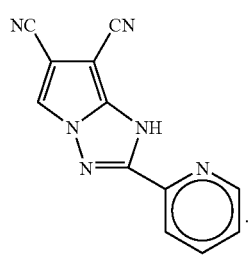
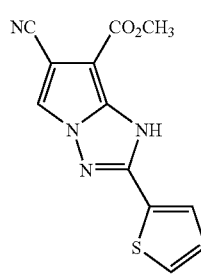
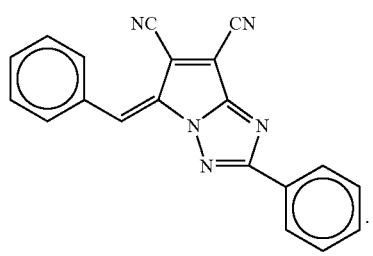
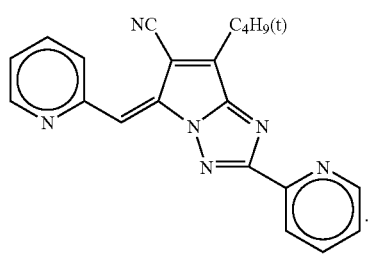
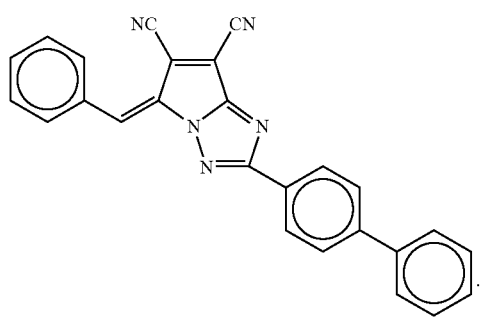
-continued
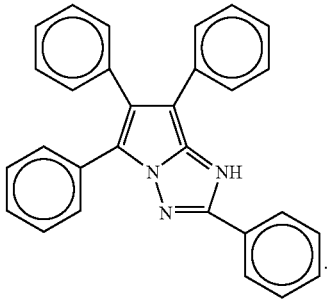
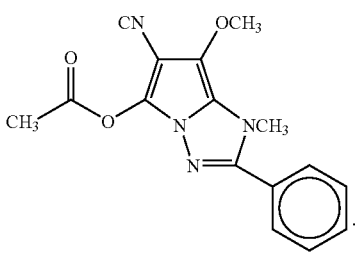
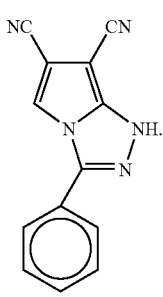
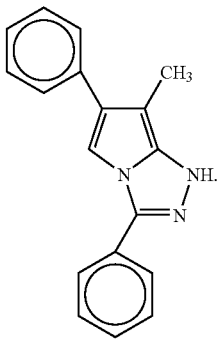
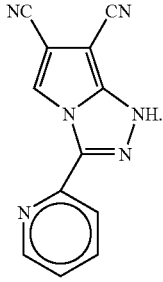

16
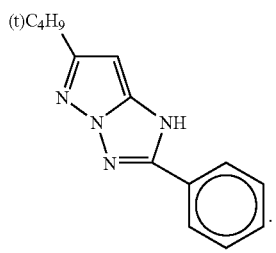
17
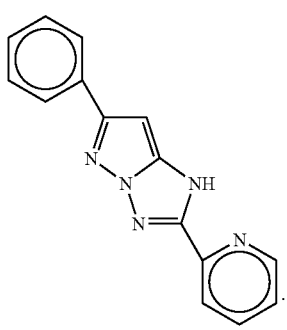
18
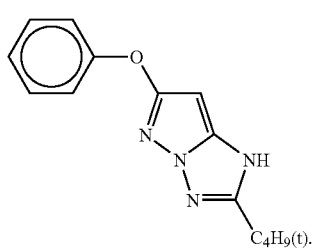
19
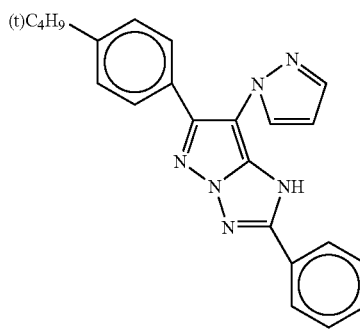
20
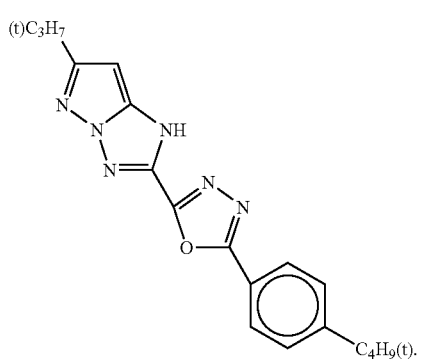
21
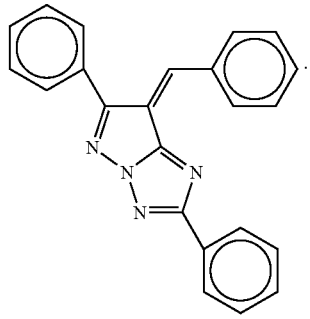
22
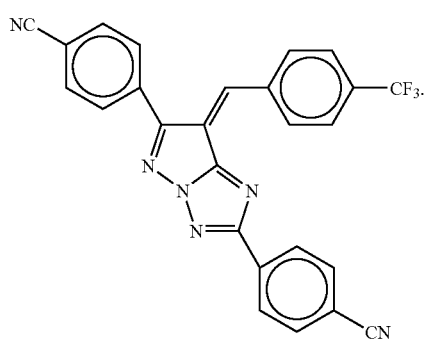
23
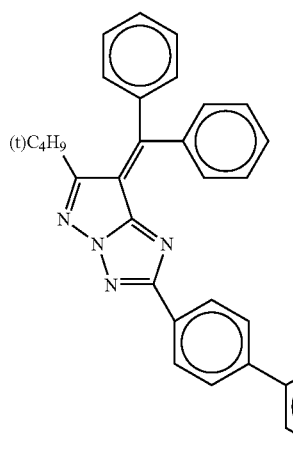
24
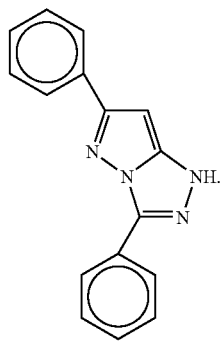

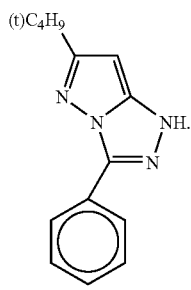
25
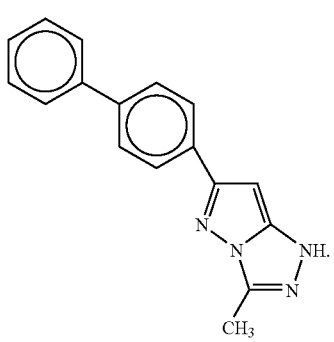
26
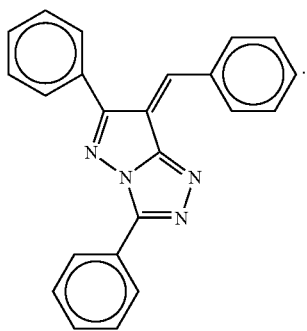
27
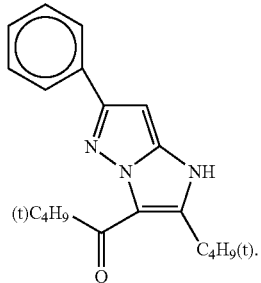
28
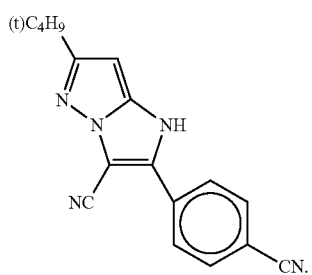
29
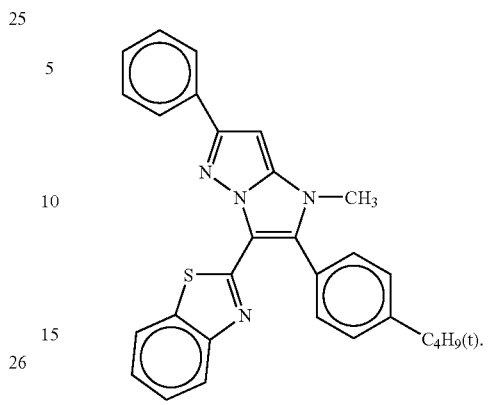
30
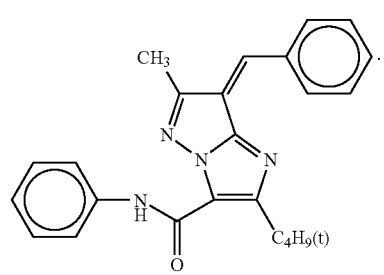
31
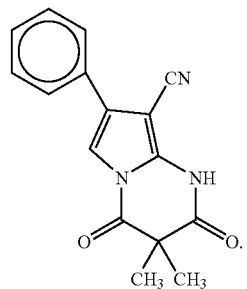
32
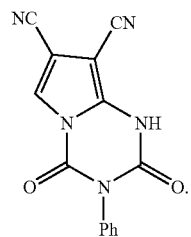
33
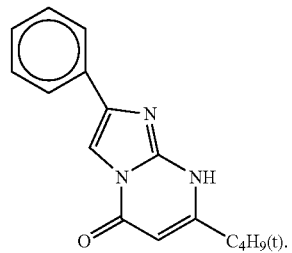
34

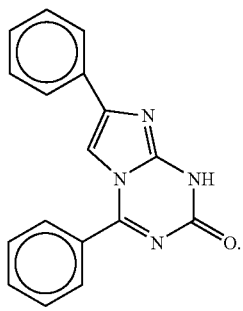
35
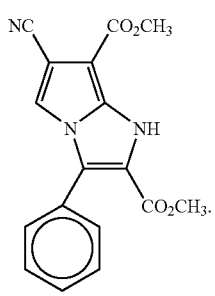
36
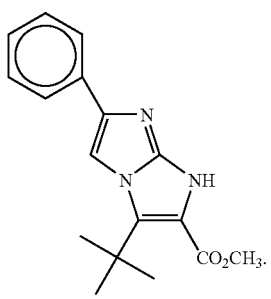
37
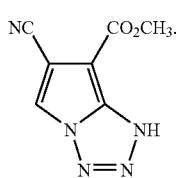
38
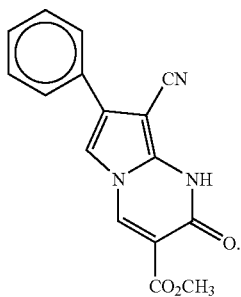
39
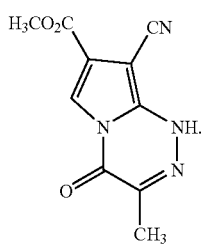
40
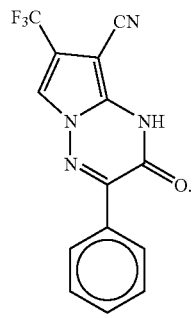
41
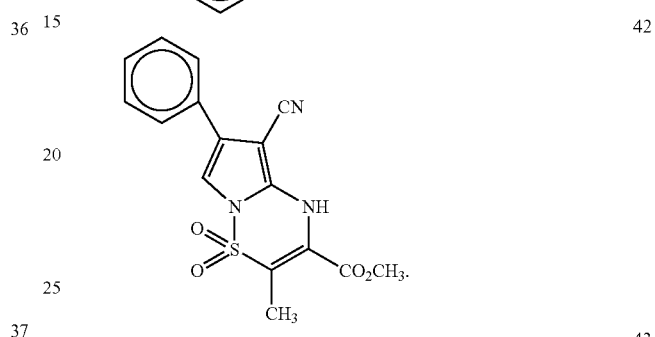
42
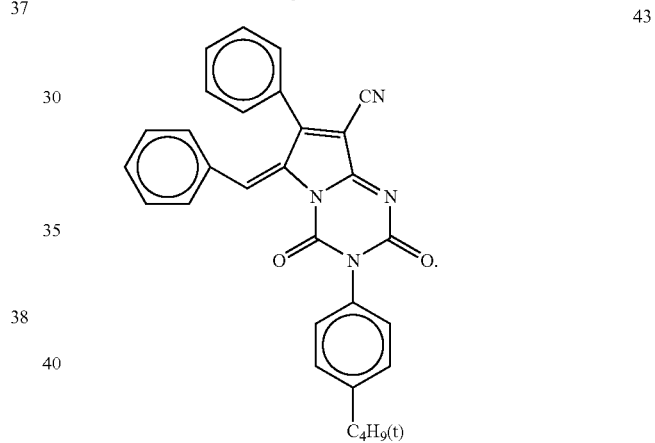
43
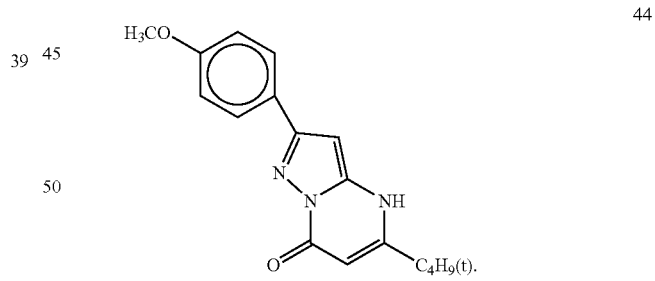
44
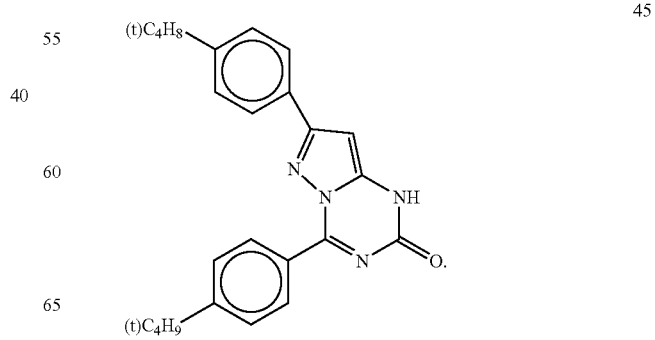
45

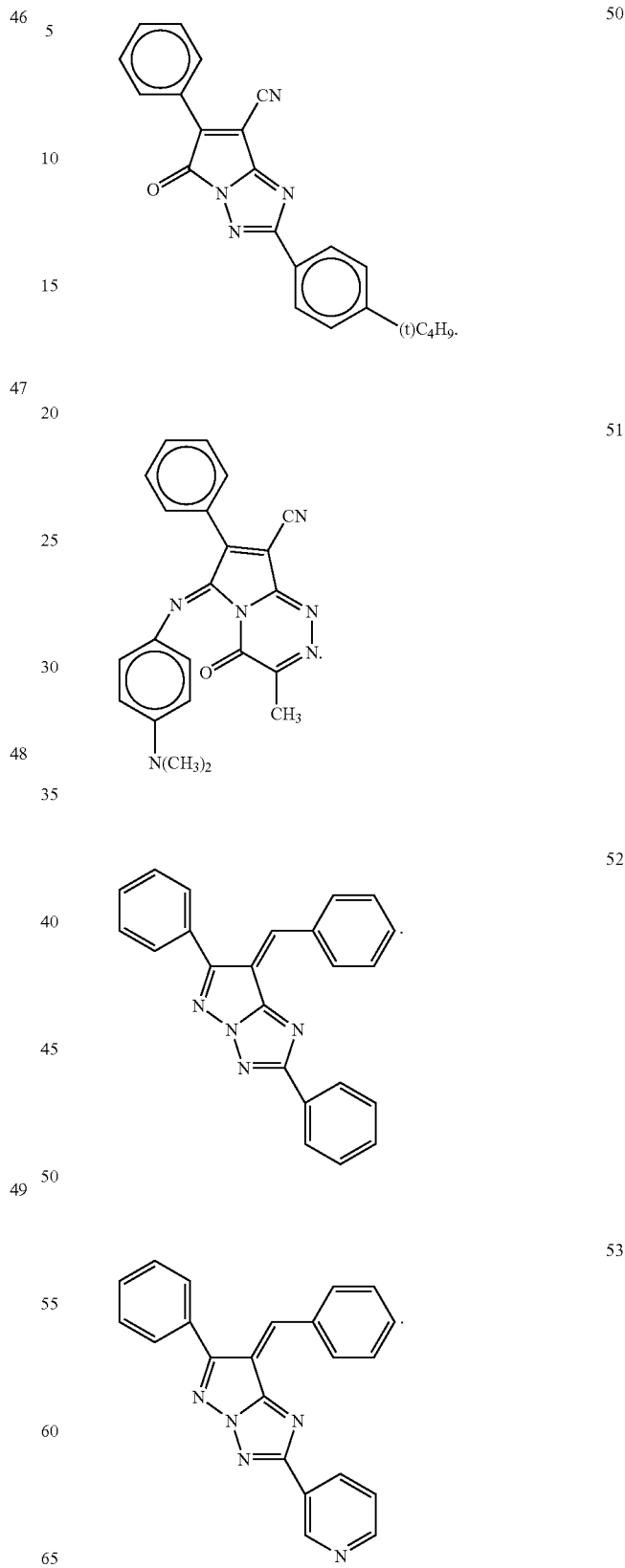

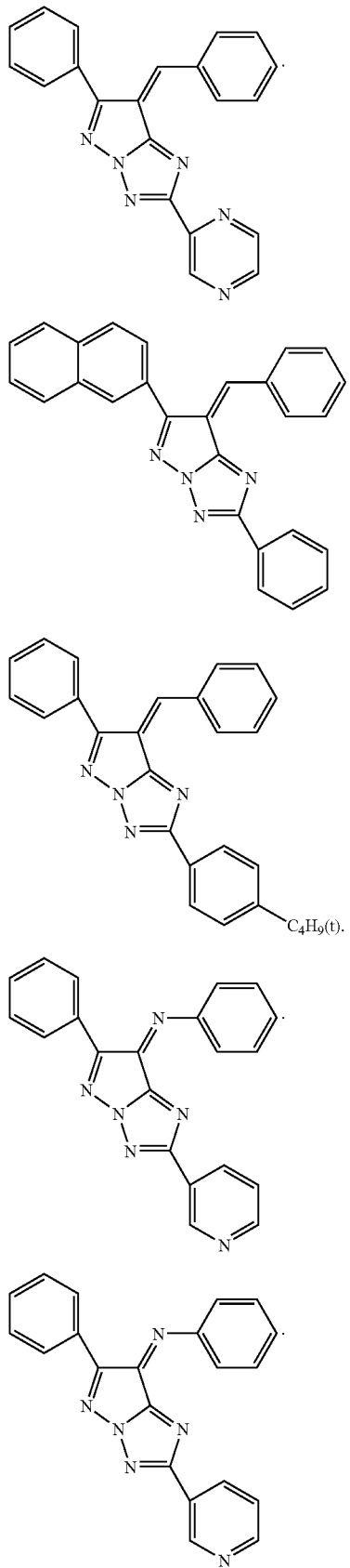
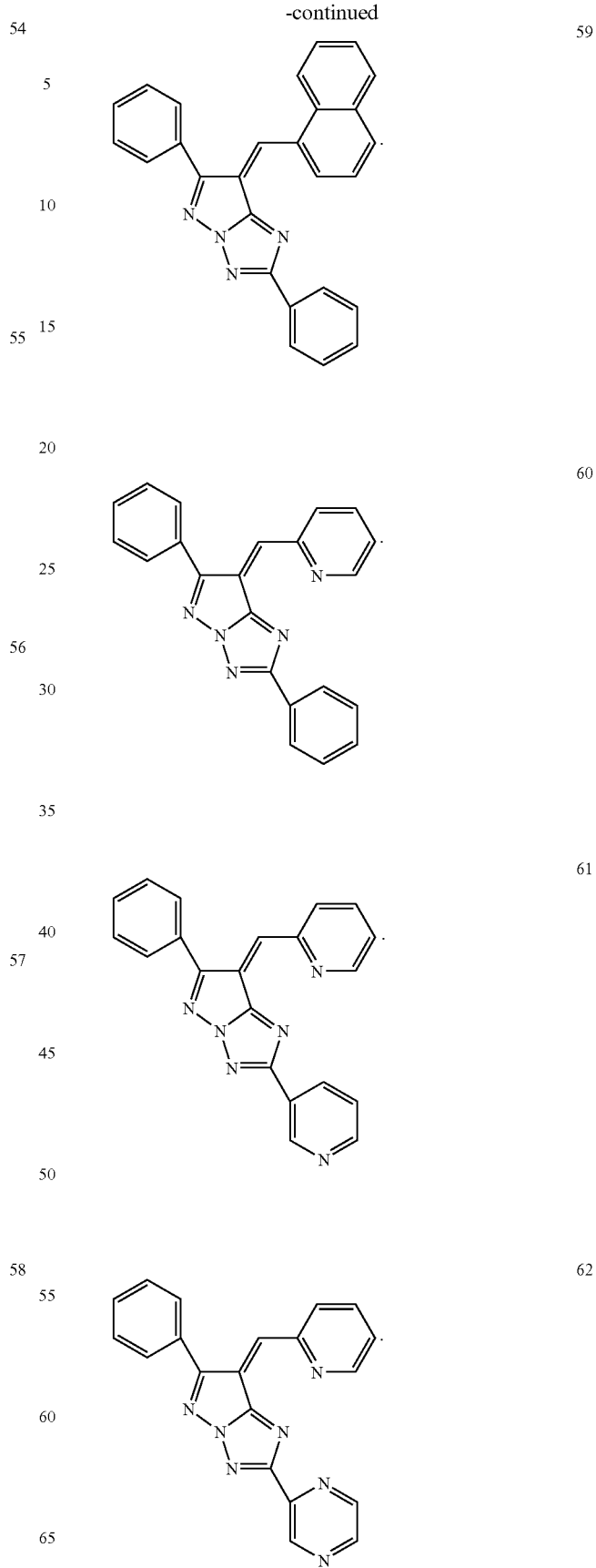

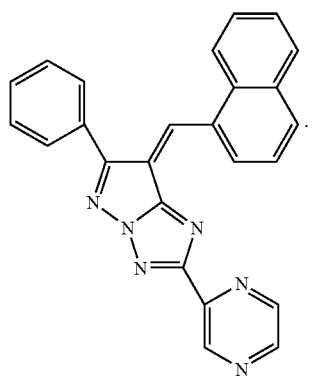
63
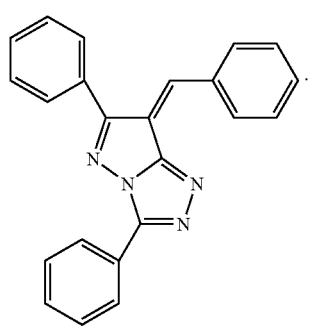
64
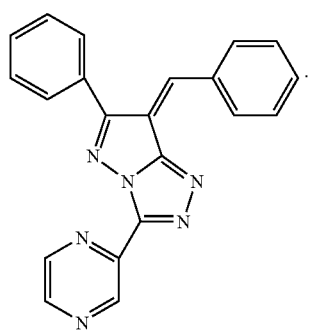
65
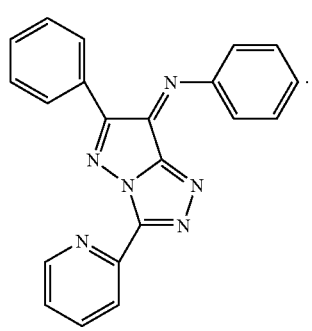
66
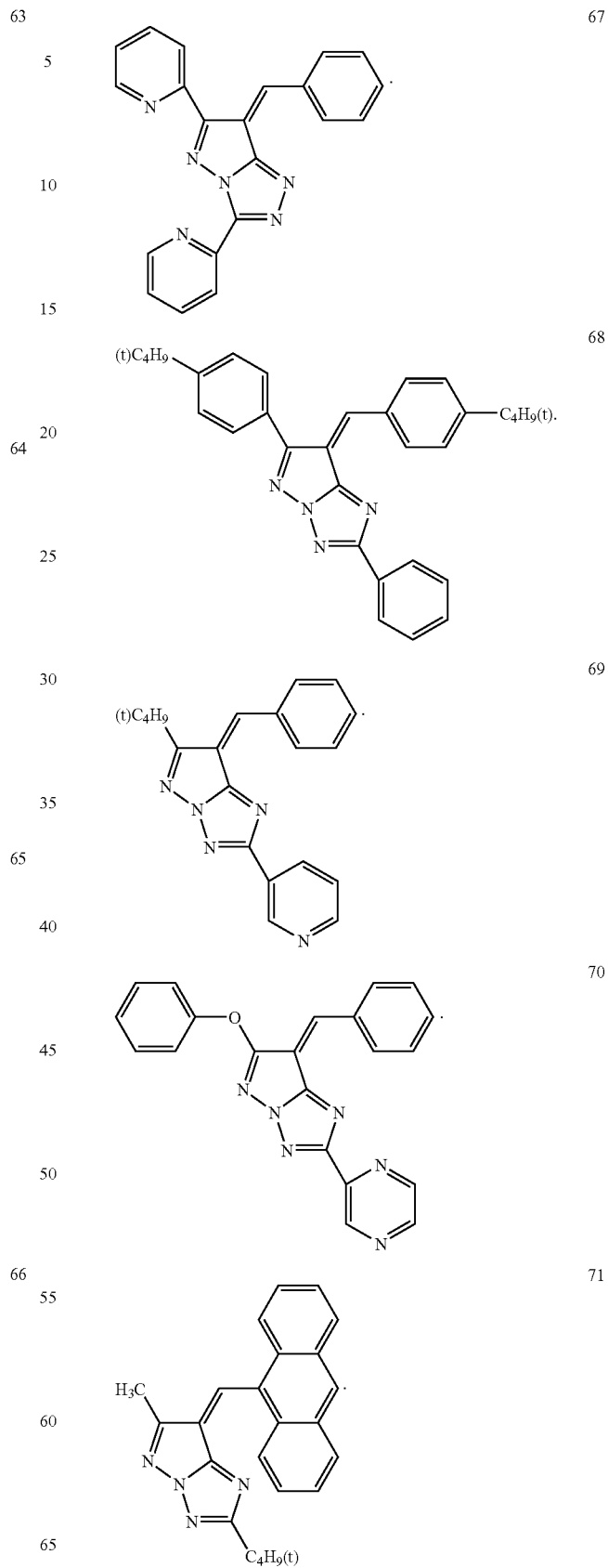

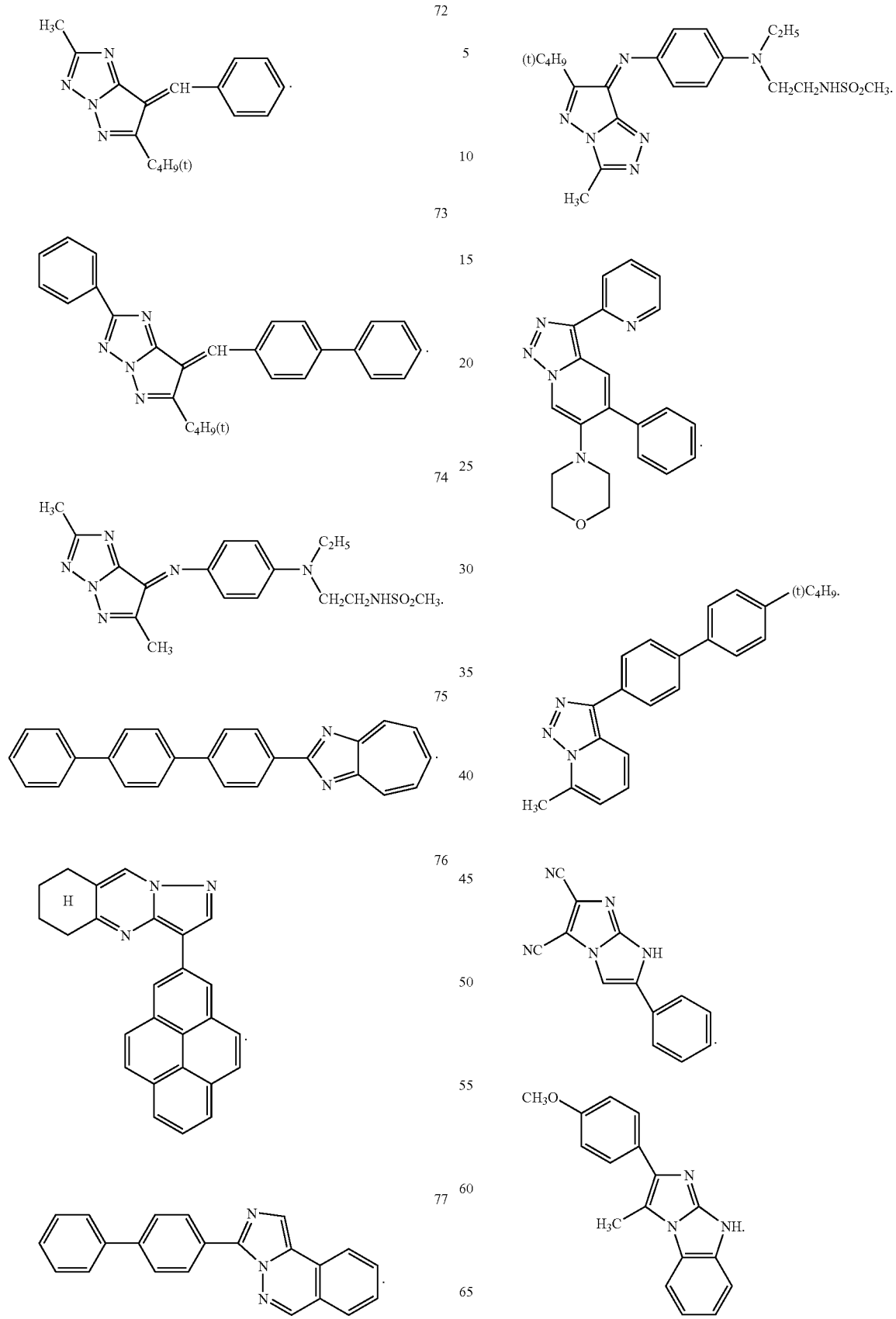

-continued
83 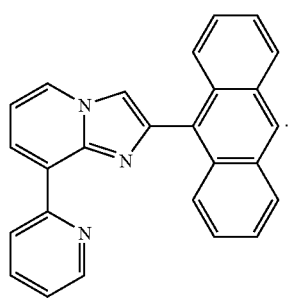
84 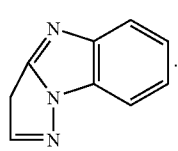
85 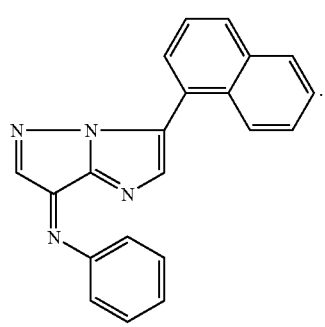
86 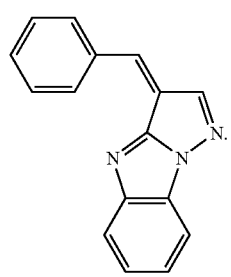
87 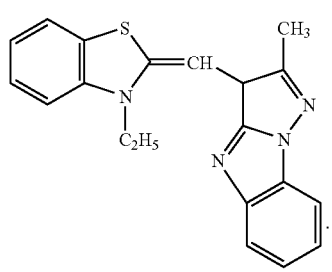
88 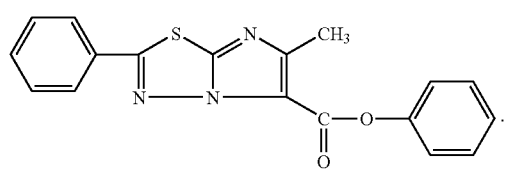
-continued
89 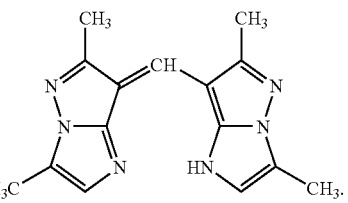
90 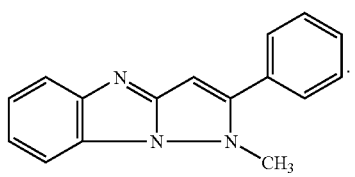
91 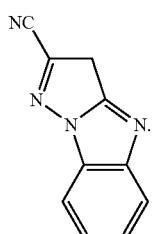
92 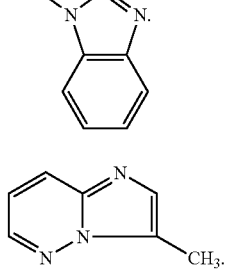
93 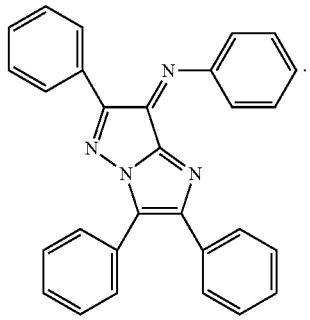
94 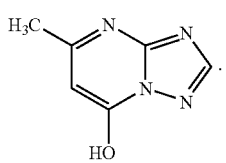
95 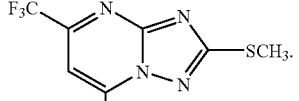
96 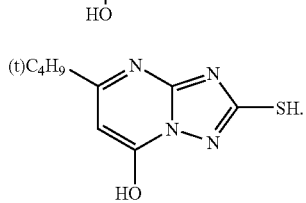

-continued
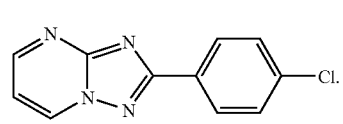 97
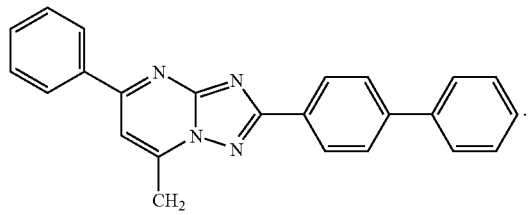 98
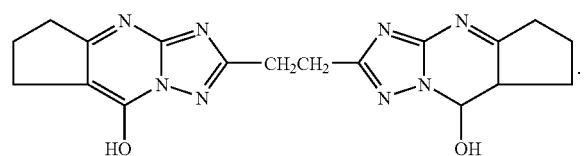 99
 100
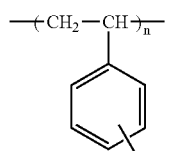 101
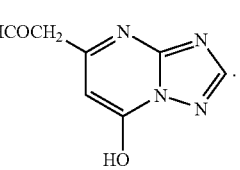
(About 15,000 in weight average molecular weight; Polystyrene conversion)
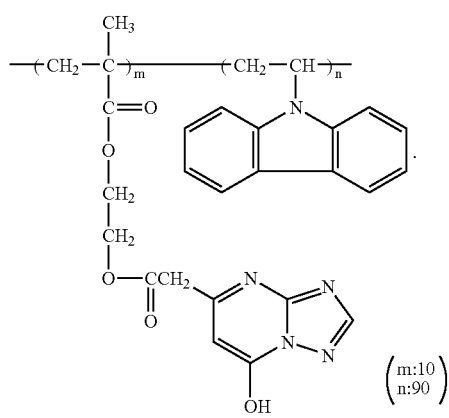 102
$\begin{pmatrix} m:10 \\ n:90 \end{pmatrix}$
(About 12,000 in weight average molecular weight; Polystyrene conversion)
-continued
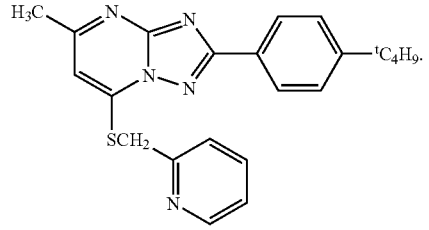 103
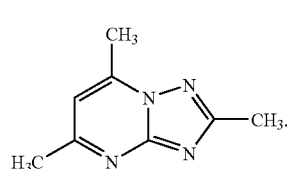 104
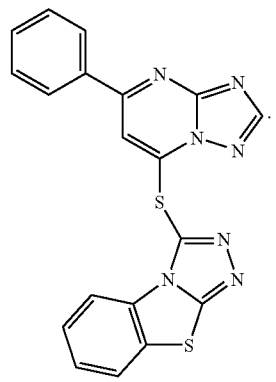 105
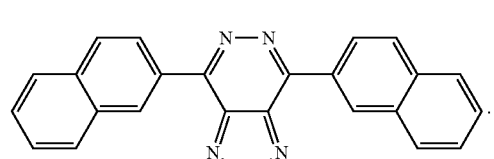 106
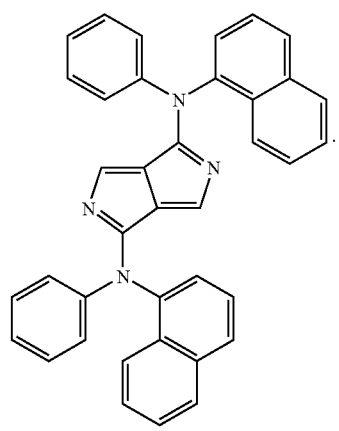 107

108 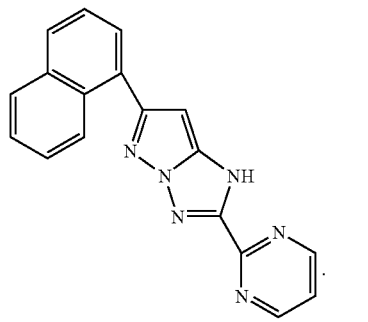
109 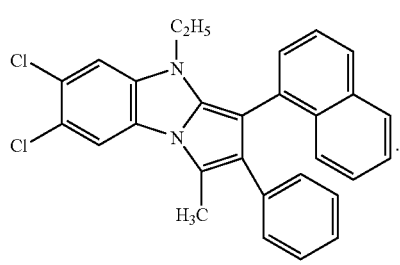
110 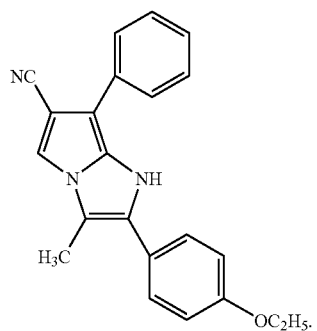
111 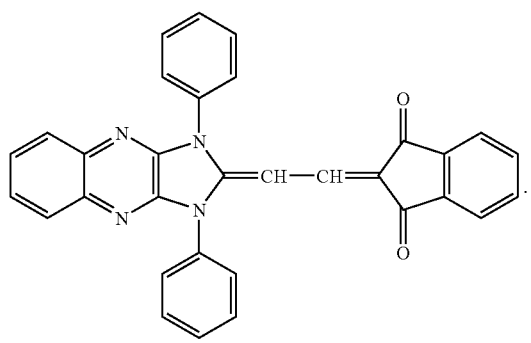
112 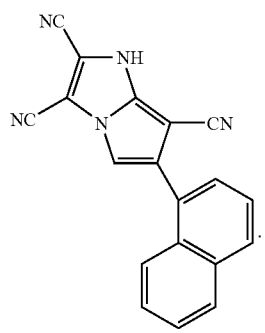
113 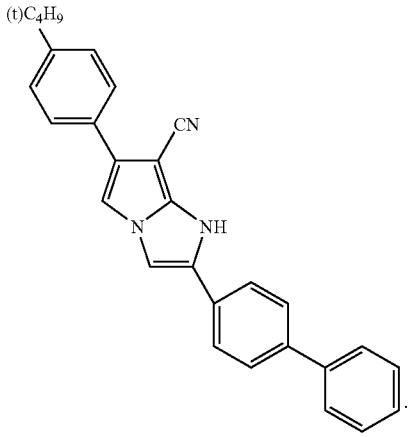
114 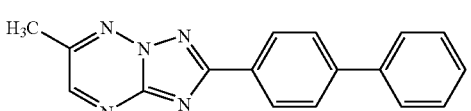
115 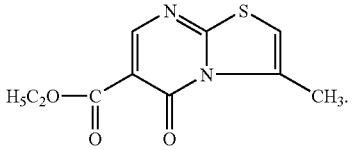
116 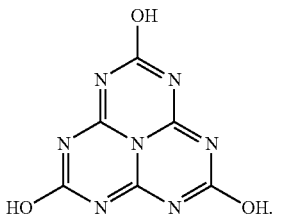
117 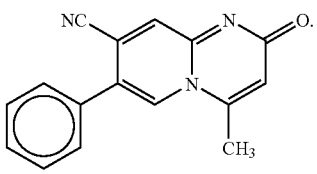
118 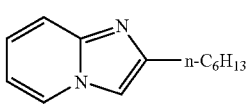
119 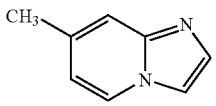
120 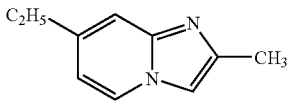
121 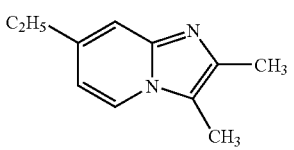

-continued
122 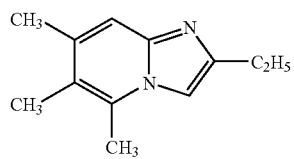
123 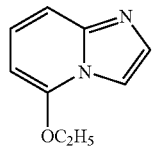
124 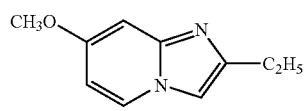
125 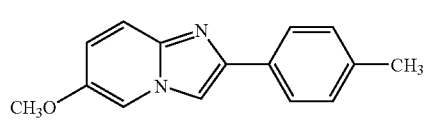
126 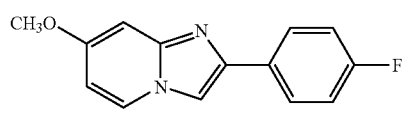
127 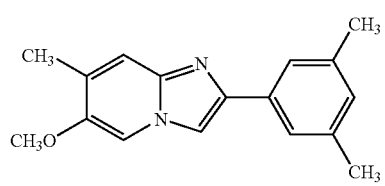
128 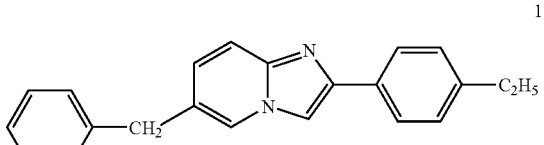
129 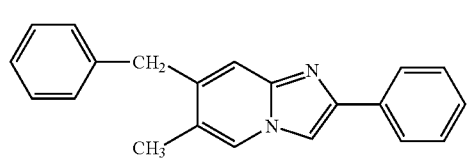
130 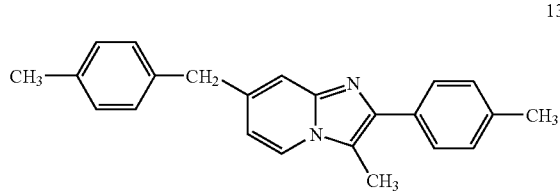
131 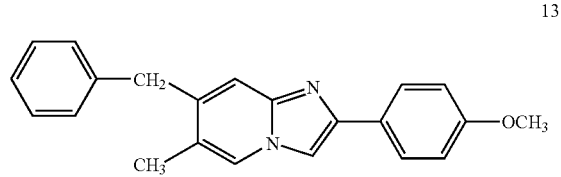
-continued
132 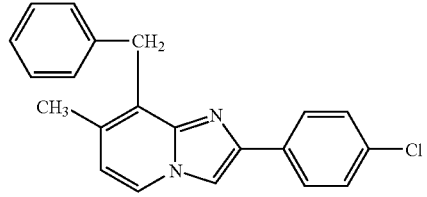
133 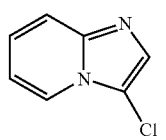
134 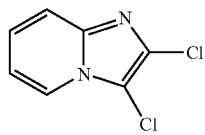
135 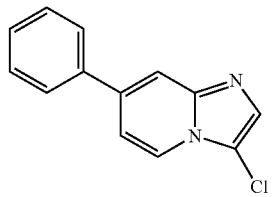
136 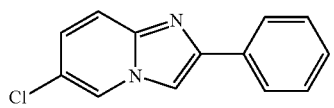
137 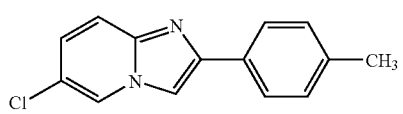
138 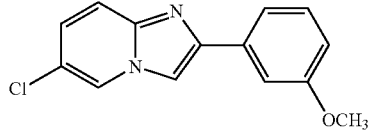
139 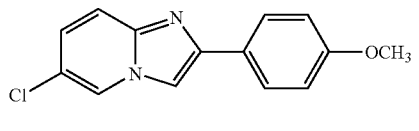
140 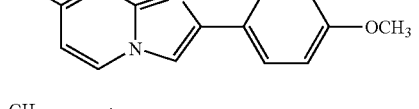
141 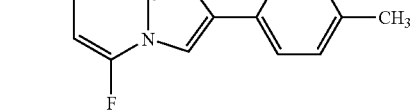
142 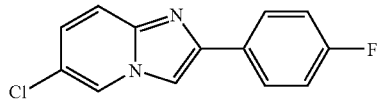

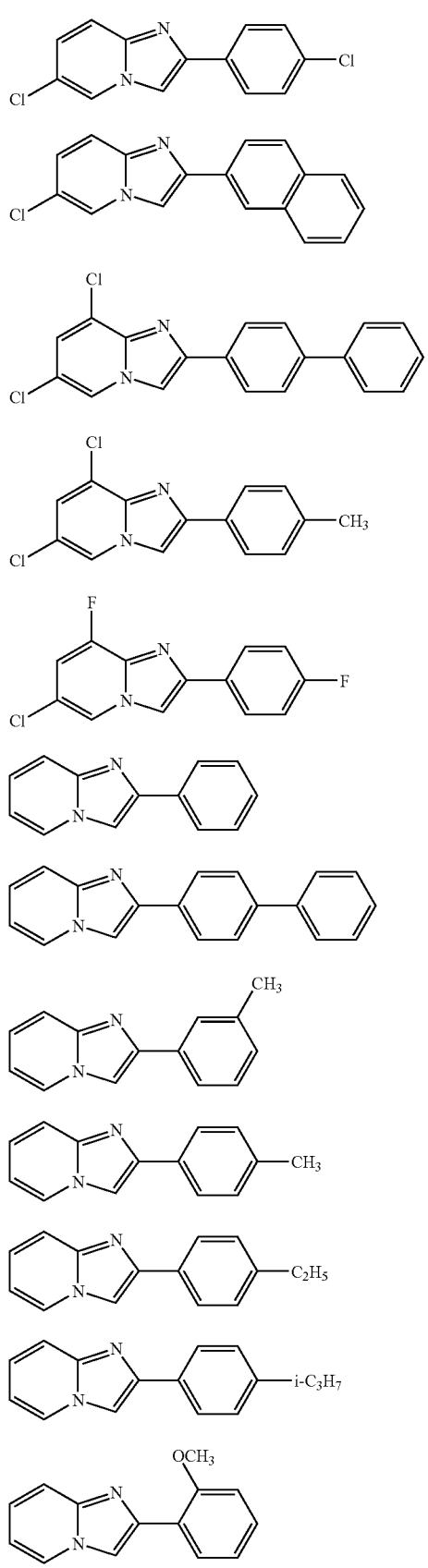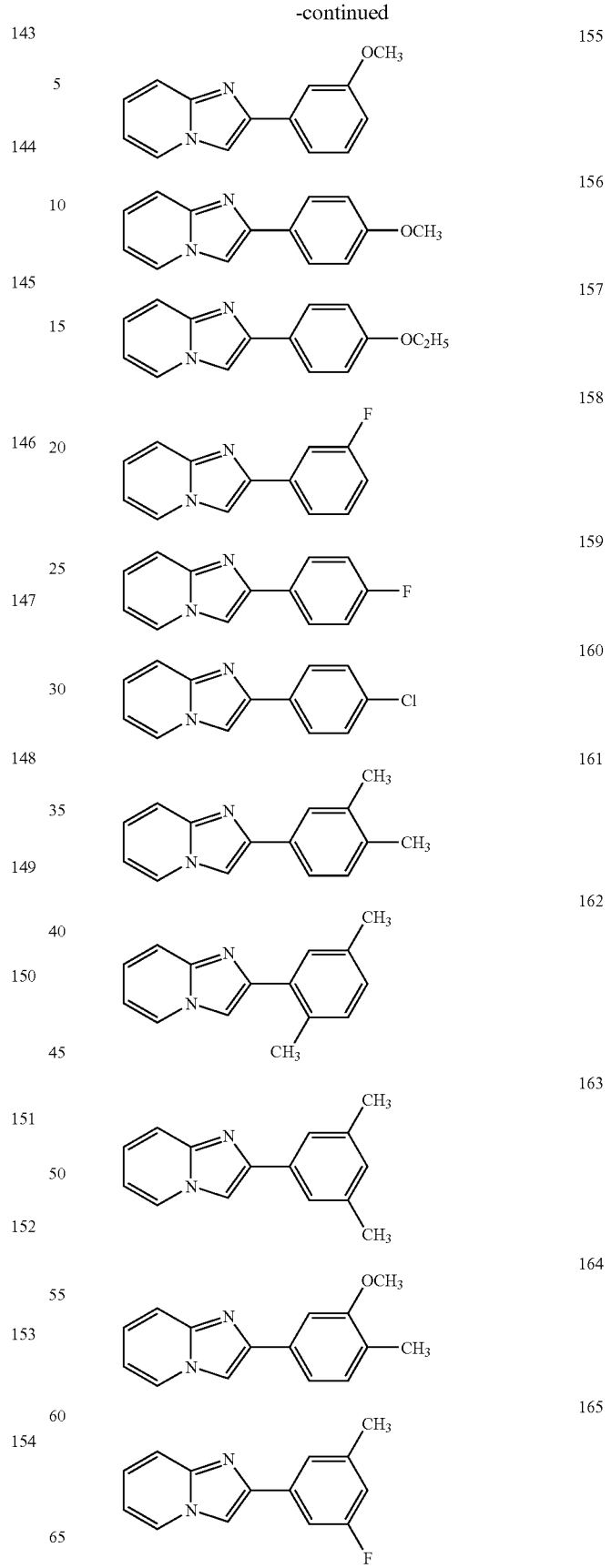

| | |
|---|---|
| 166 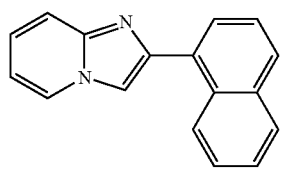 | 177 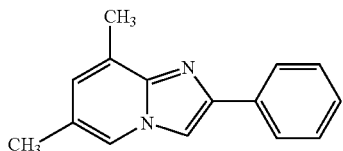 |
| 167 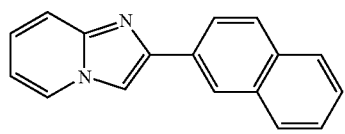 | 178 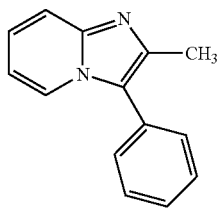 |
| 168 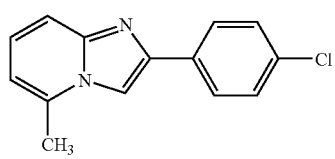 | 179 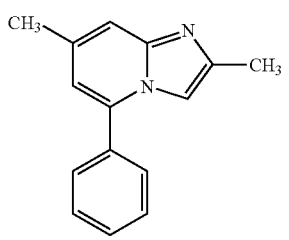 |
| 169 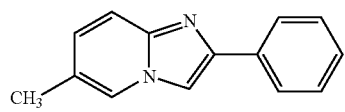 | 180 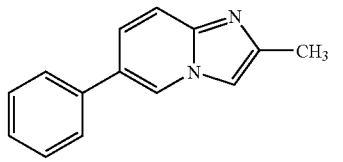 |
| 170 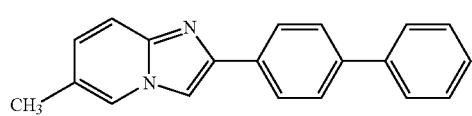 | 181 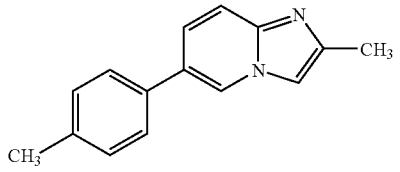 |
| 171 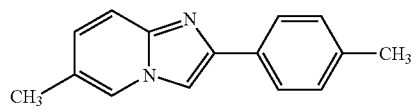 | 182 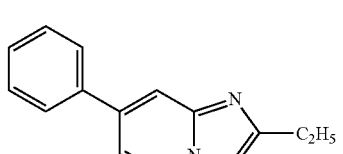 |
| 172 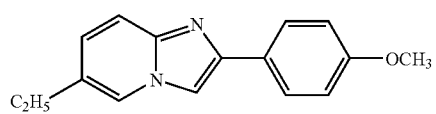 | 183 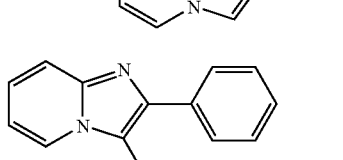 |
| 173 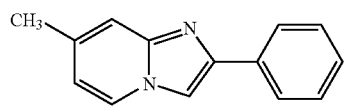 | 184 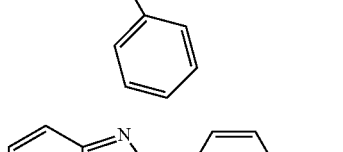 |
| 174 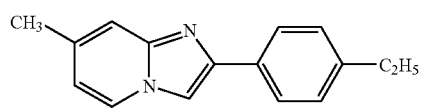 | |
| 175 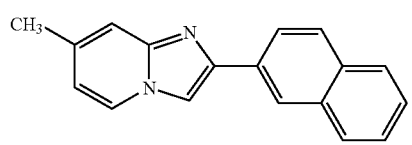 | |
| 176 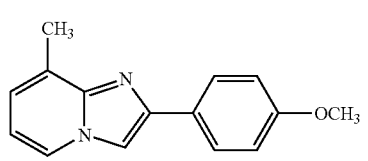 | |

-continued
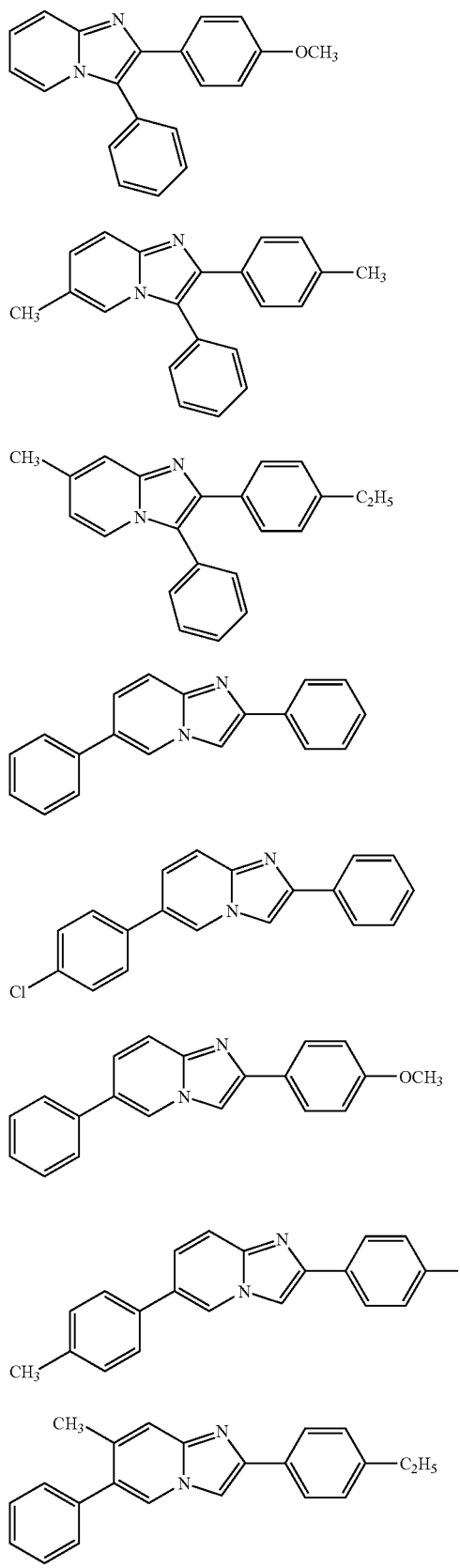
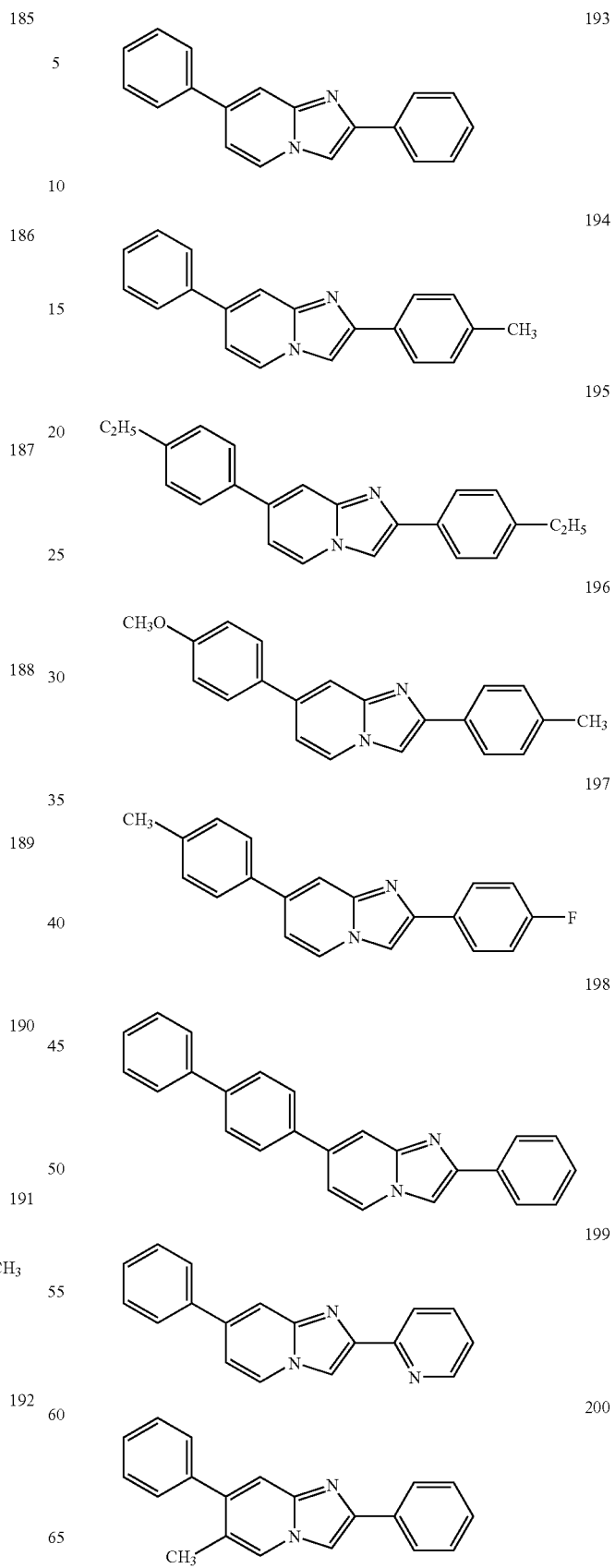

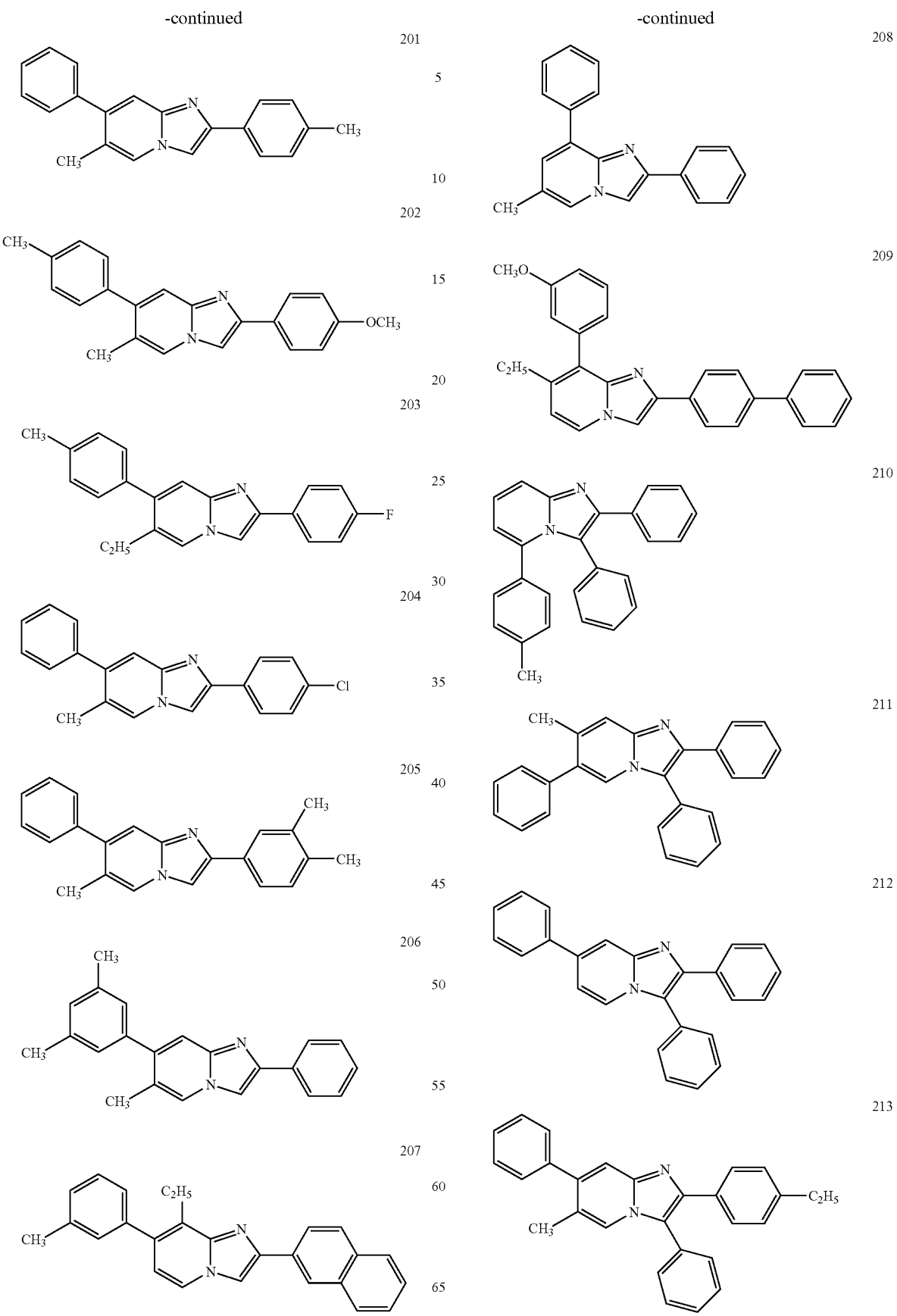

-continued
214
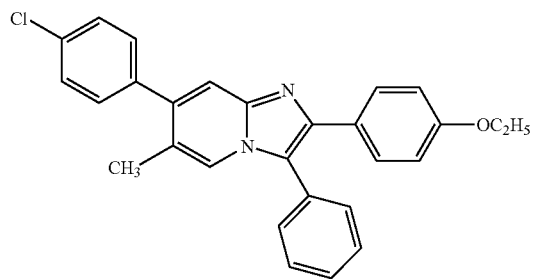
215
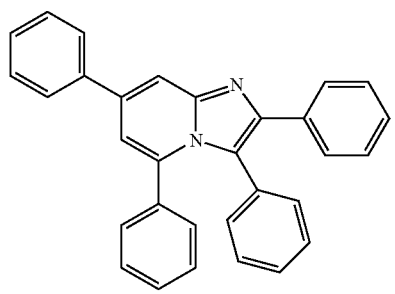
216
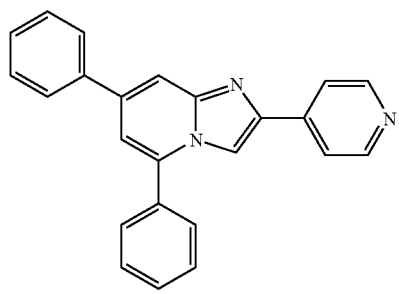
217
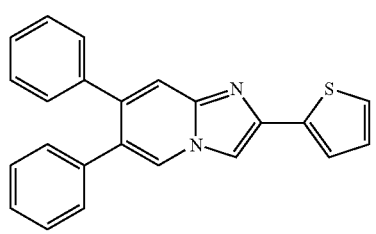
218
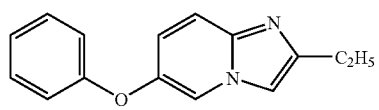
219
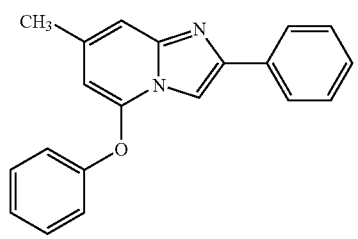
220
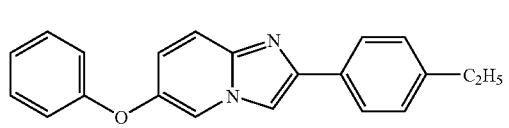
-continued
221
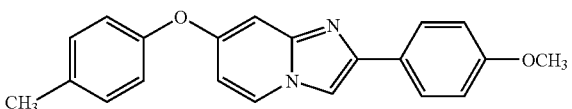
222
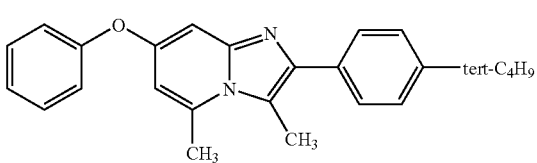
223
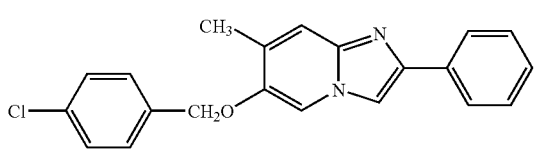
224
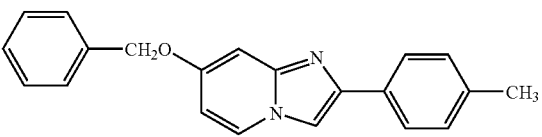
225
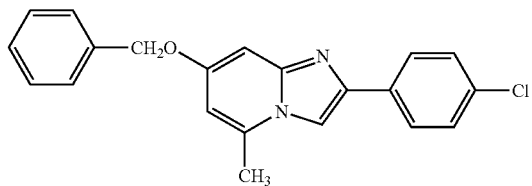
226
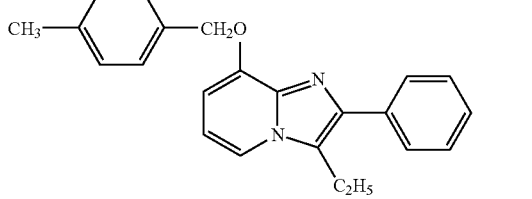
227
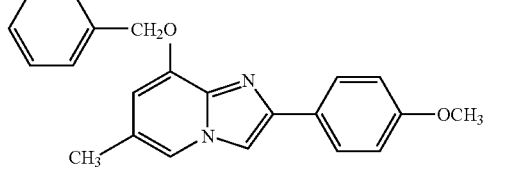
228
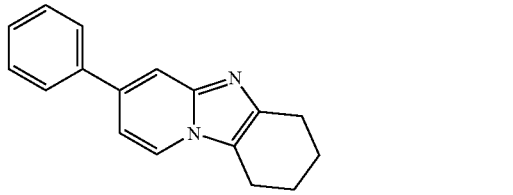
229
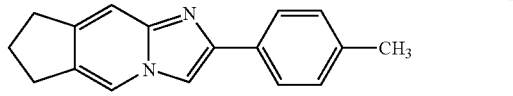

-continued
230 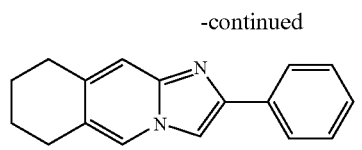
231 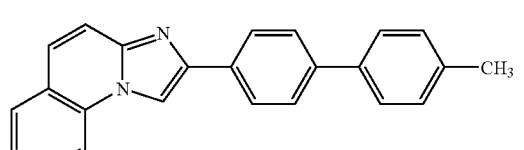
232 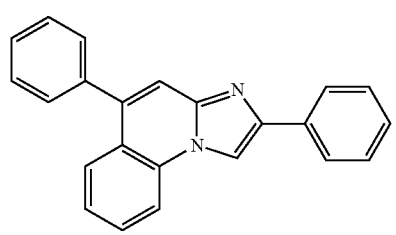
233 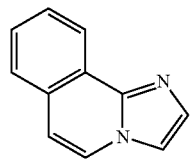
234 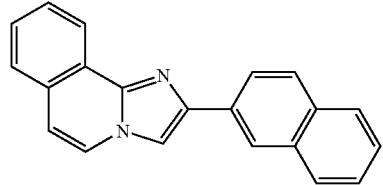
235 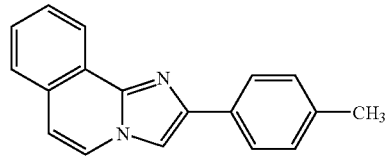
236 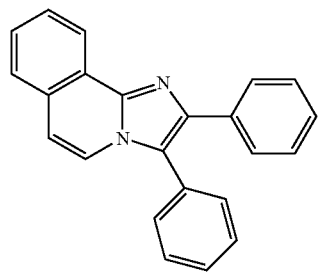
237 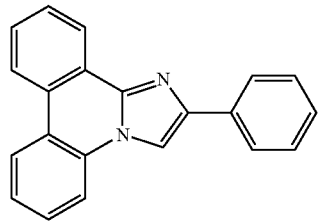
-continued
238 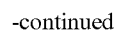
239 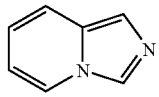
240 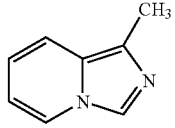
241 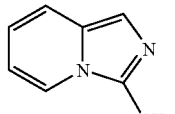
242 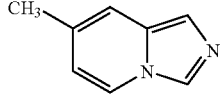
243 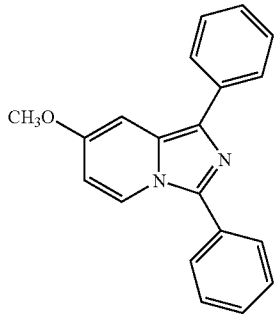
244 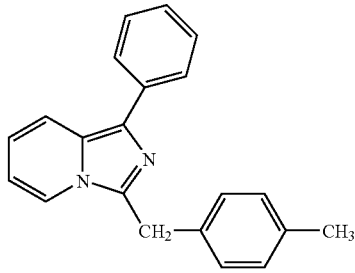
245 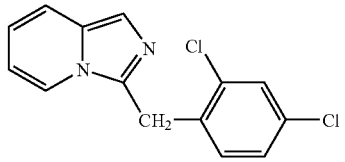
246 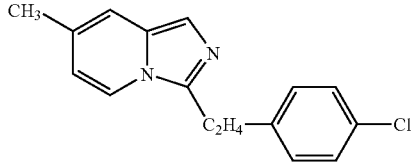

-continued
247
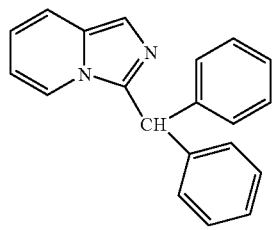
248
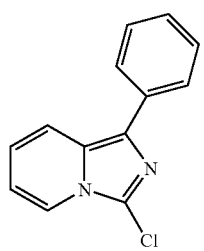
249
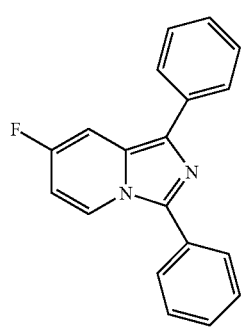
250
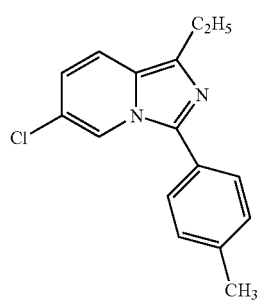
251
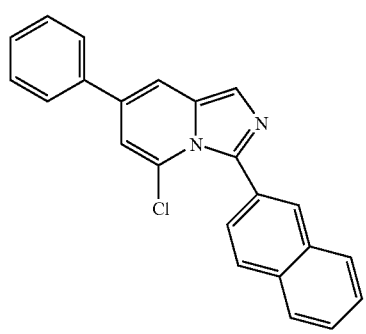
-continued
252
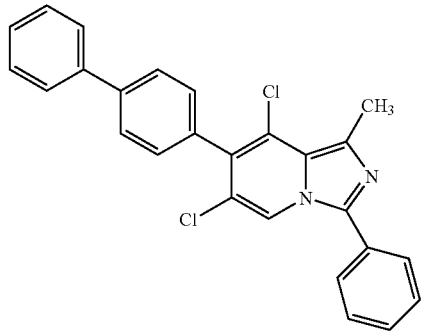
253
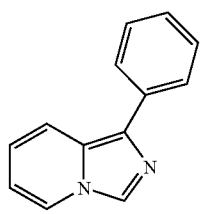
254
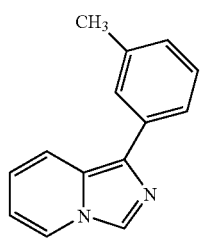
255
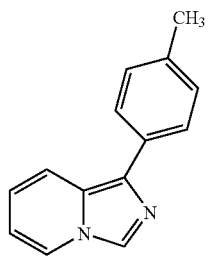
256
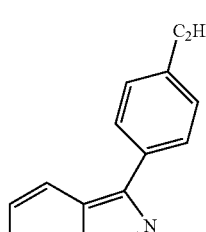
257
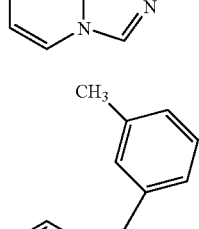
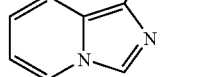

-continued
258 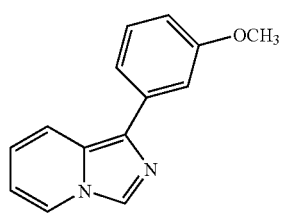
259 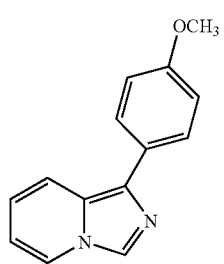
260 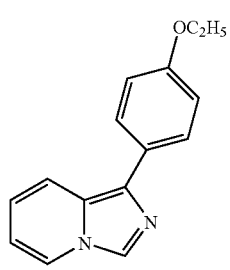
261 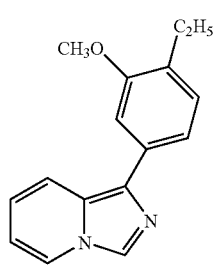
262 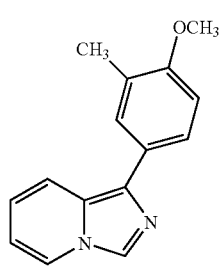
263 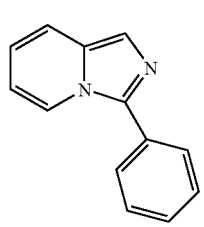
-continued
264 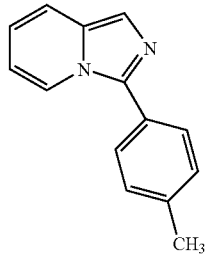
265 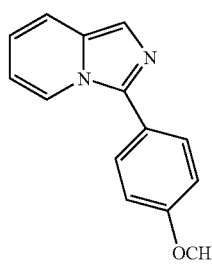
266 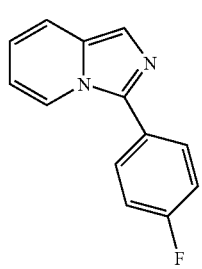
267 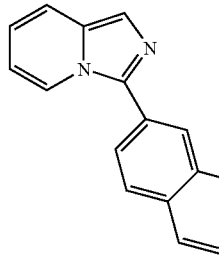
268 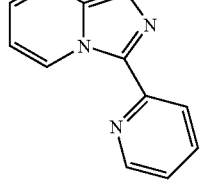
269 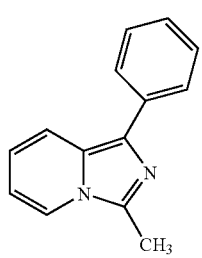

-continued
270 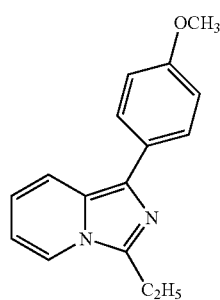
271 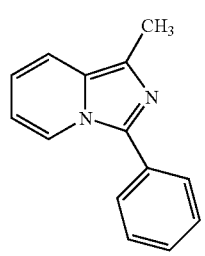
272 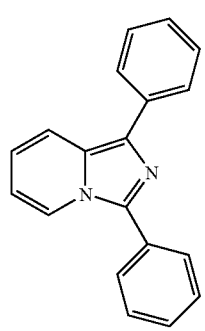
273 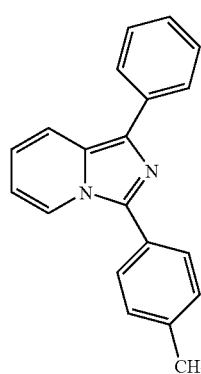
274 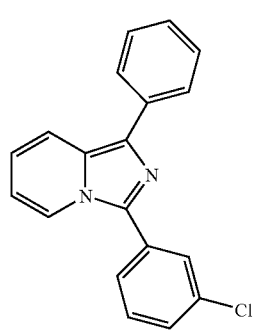
-continued
275 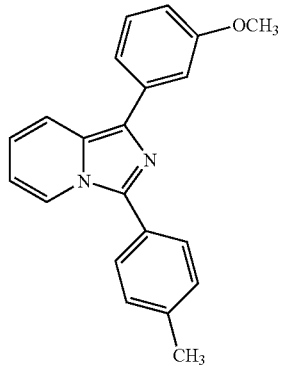
276 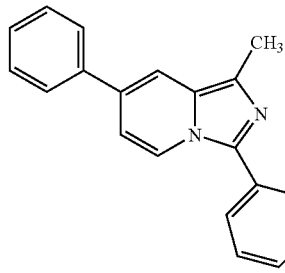
277 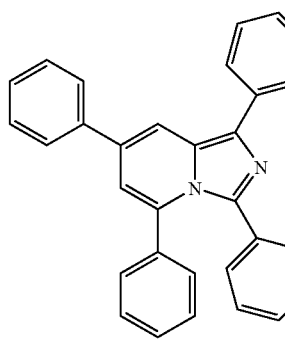
278 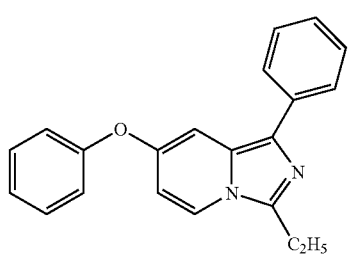
279 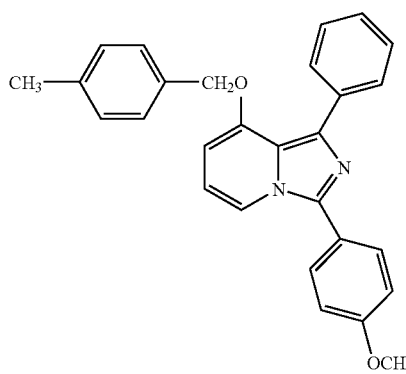

-continued
280 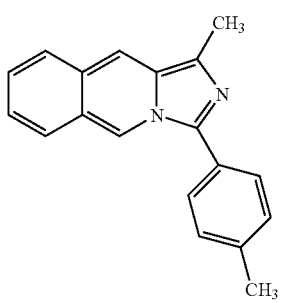
281 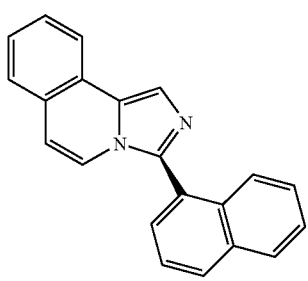
282 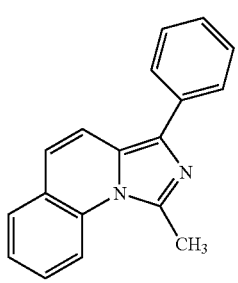
283 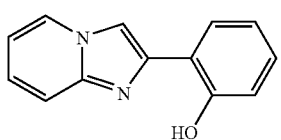
284 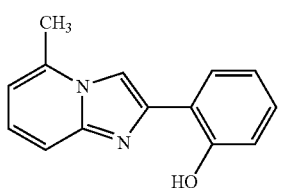
285 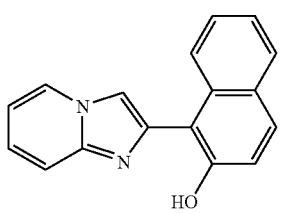
286 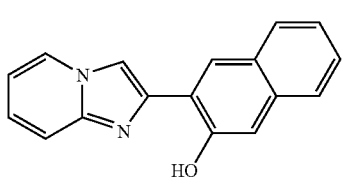
-continued
287 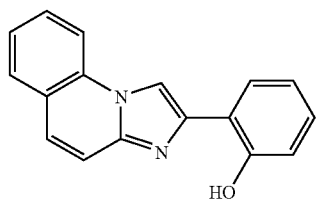
288 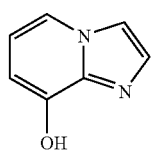
289 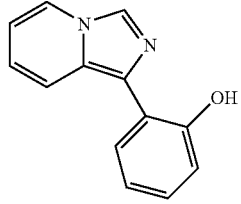
290 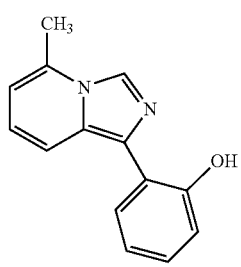
291 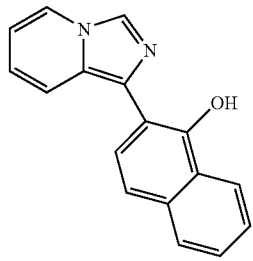
292 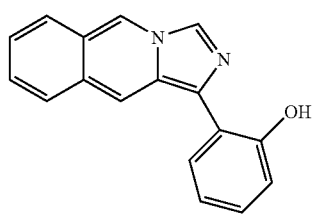

-continued
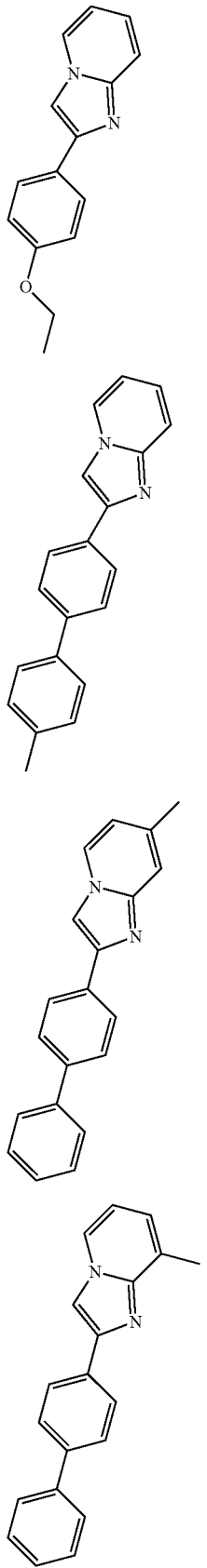
-continued
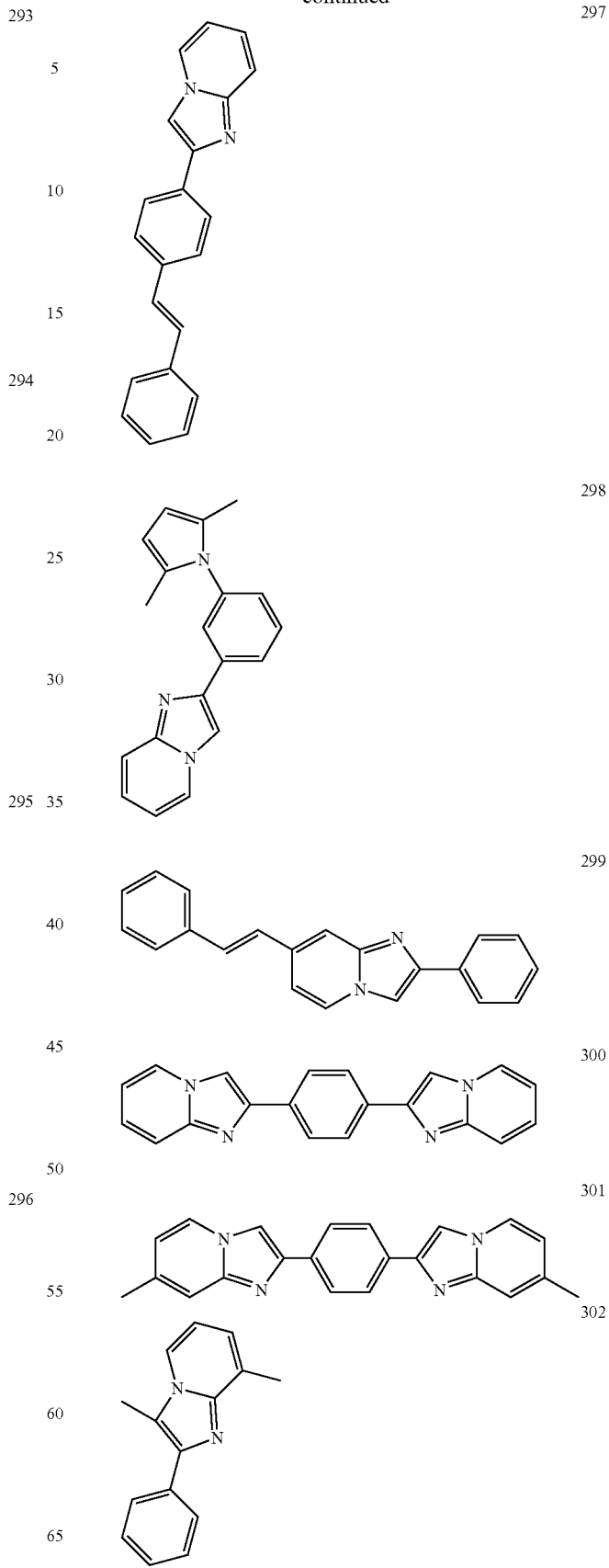

-continued
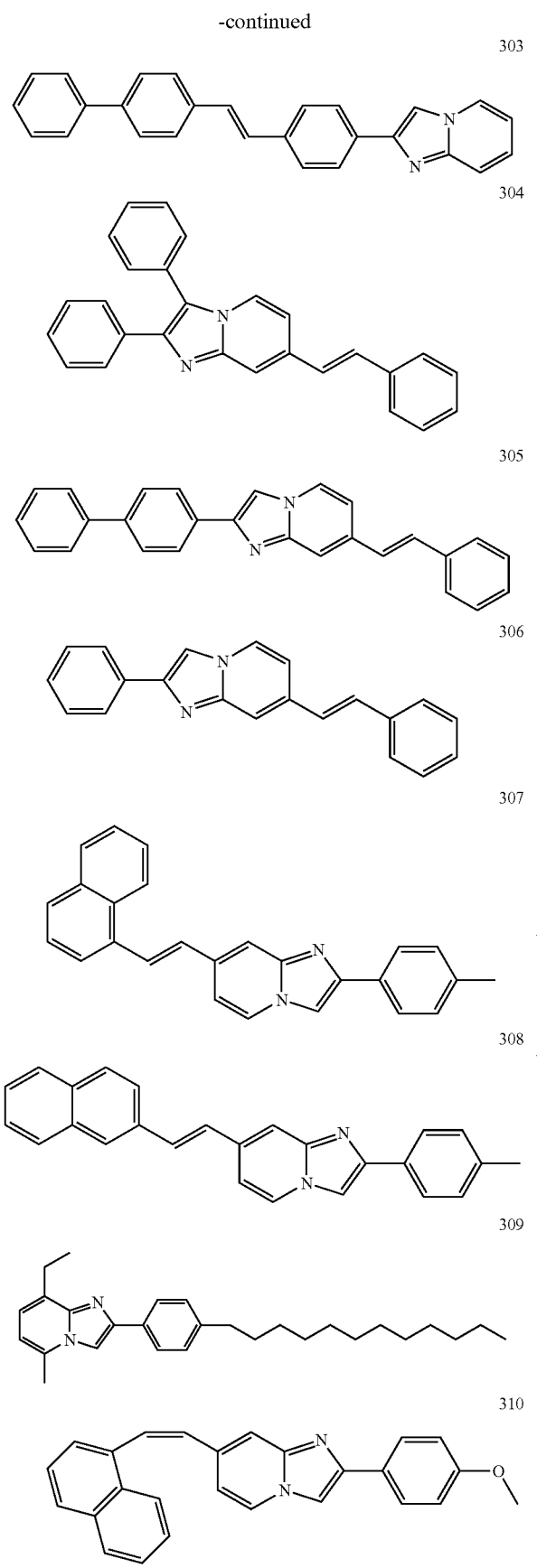
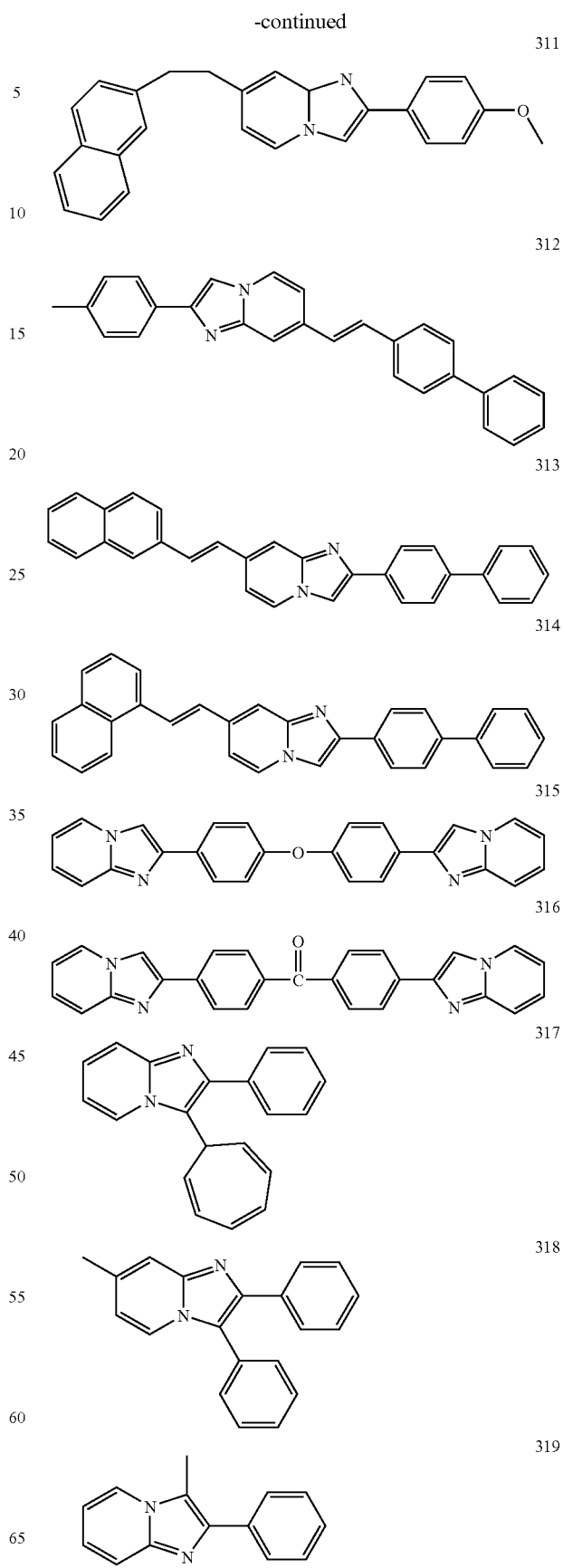

-continued

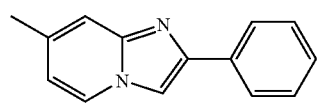
320

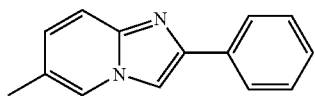
321

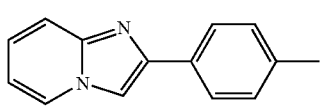
322

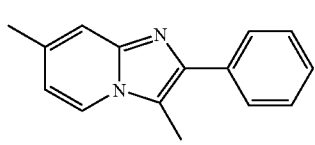
323

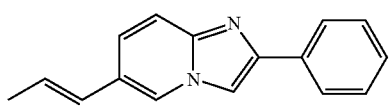
324

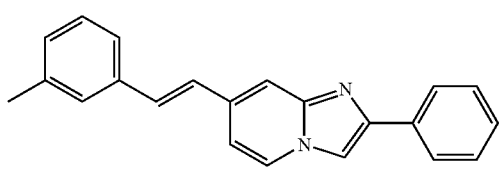
325

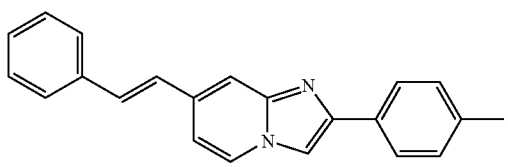
326

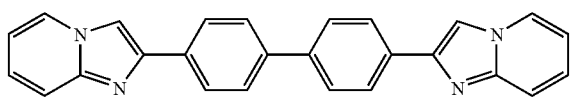
327

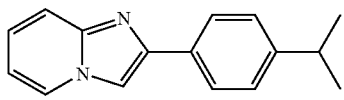
328

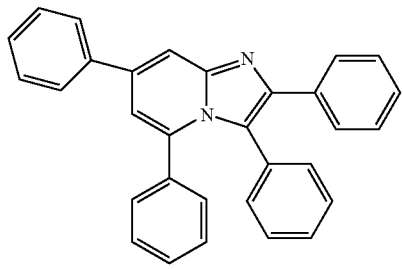
329

-continued

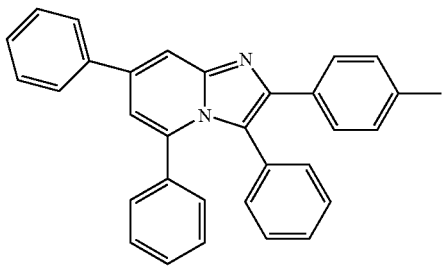
330

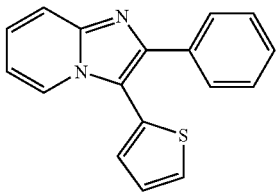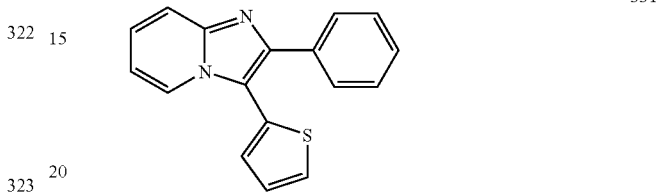
331

Following is a description about device structures regarding with the organic thin film transistor of the present invention.

The above device structure is not specified as far as it is a thin film transistor comprising at least three terminals consisting of a gate electrode, a source electrode and a drain electrode; an insulating layer and an organic semiconductor layer on a substrate, which controls its electric current flowing between the source and the drain by applying a electric voltage across the gate electrode. A device structure of public knowledge may be employable.

Among those, typical device structures of the organic thin film transistor are illustrated as Devices A, B, C and D in FIGS. 1 to 4. As the above description, a certain numbers of structures are known each about locations of the electrode, lamination sequence of layers and so on. The organic thin film transistor of the present invention has a Field Effect Transistor (FET) structure. The organic thin film transistor comprises an organic semiconductor layer (an organic compound layer), a source electrode and a drain electrode formed opposing each other with a predetermined space, and a gate electrode formed with predetermined distances from the source electrode and the drain electrode; and it has a structure which controls its electric current flowing between the source and the drain by applying a electric voltage across the gate electrode. In this occasion, the distance between the source electrode and the drain electrode is determined dependent on using purpose of the organic thin film transistor in the present invention, usually being 0.1 μm to 1 mm, preferably being 1 μm to 100 μm, and further preferably being 5 μm to 100 μm.

Among the Devices A, B, C and D, detailed explanation about an embodiment of Device A in FIG. 1 will be described below. An organic thin film transistor having a device structure illustrated as Device A comprises a gate electrode (layer) and an insulator layer in this order on a substrate, further comprises a pair of a source electrode and a drain electrode formed with a predetermined distance each other on the insulator layer, and an organic semiconductor layer formed over them. The semiconductor layer forms a channel region and an electric current flowing between the source electrode and the drain electrode is controlled by a voltage applied to the gate electrode resultantly causing an On-Off operation.

Figure 5:
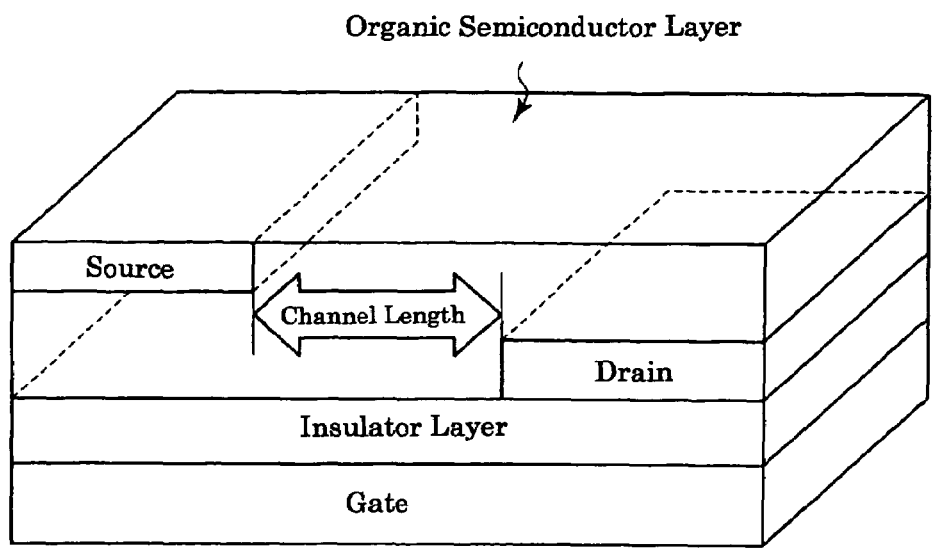
FIG. 5 is a drawing which illustrates another embodiment about device structure of an organic thin film transistor of the present invention.

Various kinds of structures are proposed about the organic thin film transistor except the above device structures in Devices A, B, C and D of the present invention. Namely, the device structure is not specified to the above Devices A, B, C and D on the condition that it has a mechanism revealing an effect in which an electric current flowing between the source electrode and the drain electrode is controlled by a voltage applied to the gate electrode resultantly causing an On-Off operation or amplification. Examples of the device structure may include a top and bottom contact type organic thin film transistor (refer to FIG. 5) proposed in proceedings for the 49th Spring Meeting, The Japan Society of Applied Physics, 27a-M-3 (March, 2002) by Yoshida et al. in National Institute of Advanced Industrial Science and Technology, or a vertical type organic thin film transistor (refer to FIG. 6) proposed on page 1440 in IEEJ transactions 118-A (1998) by Kudo et al. of Chiba University.

A substrate in the organic thin film transistor of the present invention covers a role of supporting structures for the organic thin film transistor, and aside from glasses, inorganic compound such as metal oxide or metal nitride, plastics (PET, PES and PC) or metal substrate, these composite and lamination are employable as a material for the substrate. Further, in an occasion that the structures for the thin film transistor are supported enough by means of constituting element except the substrate, the substrate may be absent.

Figure 6:
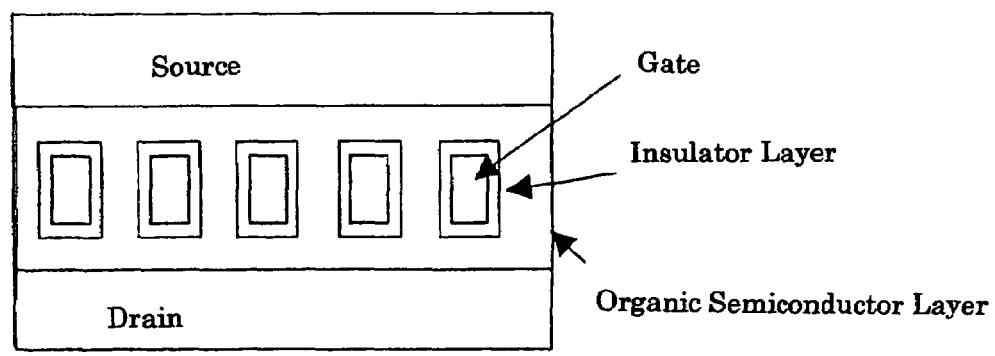
FIG. 6 is a drawing which illustrates still another embodiment about device structure of an organic thin film transistor of the present invention.

Furthermore, a silicon (Si) wafer is frequently used as a material for the substrate. In this case, Si may be used by itself as a gate electrode together with as the substrate. Still further, a surface of Si substrate may be oxidized to form SiO2, which may be utilized as an insulating layer. In this case, taking the above Device A into an embodiment, a metal layer employing Au and so on as an electrode for connecting a lead wire is often formed in a manner as shown in FIG. 6, on the Si substrate which is the gate electrode commonly used as the substrate.

Examples of the material for the gate electrode, the source electrode and the drain electrode in the thin film transistor of the present invention include metals and alloys such as chromium (Cr), titanium (Ti), copper (Cu), aluminum (Al), molybdenum (Mo), tungsten (W), nickel (Ni), gold (Au), palladium (Pd), indium, platina (Pt), silver (Ag), tin (Sn), magnesium, magnesium-indium alloy, magnesium-aluminum alloy, aluminium-lithium alloy, aluminium-scandium-lithium alloy, magnesium-silver alloy, etc.; indium tin oxide (ITO) alloy, heavy dope silicon, stannic oxide (NESA), electroconductive polyaniline, electroconductive polypyrrole, electroconductive polythiazyl and electroconductive polymer, etc.; together with any combination of those materials. Those materials reduce the contact resistance and improve the electric property of the thin film transistors. It is preferable that the thickness of the gate electrode, the source electrode and the drain electrode is within a range of 30 to 500 nm respectively. Usually, they are formed by means of, for example, vapor deposition, sputtering, chemical vapor deposition, electrodeposition, electroless plating, spin coating, printing or coating.

Examples of the material for the insulator layer in the thin film transistor of the present invention include silicon oxide, silicon nitride, titanium oxide, barium oxide, strontium oxide, zirconium oxide, lead oxide, lanthanum oxide, fluorine oxide, magnesium oxide, bismuth oxide, tantalum oxide, niobium oxide, etc.; and specific examples include silicon dioxide, barium titanate strontium, zirconic acid barium titanate, zirconic acid lead titanate, lead titanate lanthanum, strontium titanate, barium titanate, barium fluoride magnesium, titanic acid bismuth, strontium titanate bismuth, tantalum pentoxide, tantalic acid strontium bismuth, tantalic acid niobic acid bismuth, titanium di-oxide, yttrium tri-oxide, etc.; together with any combination of those materials. Further, silicon nitride-based compound such as $Si_3N_4$, $Si_xN_y$ (x, y>0), $SiON_x$ are preferable as the material for the insulator layer.

Further, the insulator layer may be formed with a precursor including alkoxide metal. For example, applying a solution prepared by dissolving the precursor over the substrate, followed by chemical solution treatment or heat treatment will form the insulator layer.

The metal in the above alkoxide metal is selected from transition metal, lanthanoid or main group element, and specific examples include barium (Ba), strontium (Sr), titanium (Ti), bismuth (Bi), tantalum (Ta), zircon (Zr), iron (Fe), nickel (Ni), manganese (Mn), lead (Pb), lanthanum (La), lithium (Li), sodium (Na), potassium (K), rubidium (Rb), cesium (Cs), francium (Fr) beryllium (Be) magnesium (Mg), calcium (Ca), niobium (Nb), thallium (Tl), mercury (Hg), copper (Cu), cobalt (Co), rhodium (Rh), scandium (Sc), yttrium (Y), etc.

Further, examples of the alkoxide in the above alkoxide metal are derived from alcohols including methanol, ethanol, propanol, isopropanol, butanol, isobutanol, etc.; or alkoxy alcohols including methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, heptoxypropanol, etc.

In the present invention, employing the above material for the insulator layer easily generates a cavity layer among the insulator layer and as a result, enables to reduce a threshold voltage of transistor operation. Particularly, employing silicon nitrides such as $Si_3N_4$, $Si_xN_y$ (x, y>0), $SiON_x$, and so on among the above materials for the insulator layer more easily generates a cavity layer among the insulator layer and as a result, enables to further reduce a threshold voltage of transistor operation. Additionally, the thickness of the insulator layer is preferably within the range of from 10 to 150 nm, and the insulator layer is usually formed, for example, in accordance with a vacuum vapor deposition process, a sputtering process, a thermal chemical vapor deposition (CVD) process, a thermal oxidation process, an anodic oxidation process, etc.

Although the film thickness of the organic semiconductor layer in the organic thin film transistor of the present invention is not particularly specified, it is usually within a range of from several nm to 1 μm, and preferably within a range of from 10 nm to 250 nm. Further, although a process for forming the organic semiconductor layer is not particularly specified, various kinds of well-known processes such as a molecular beam evaporation process (MBE process); a vacuum vapor deposition process; a chemical vapor deposition process; a printing or coating process of a solution prepared by dissolving a material into a solvent, such as a dipping process, a spin coating process, a casting process, a bar caoting process, a roller coating process, etc.; a baking process; electropolymerization process; a molecular beam adhesion process; a self-assembly process from solution; are employable singly or in combination with the use of the above materials for the organic semiconductor layer.

Although a method for forming the organic thin film transistor of the present invention may be in accordance with any well-known method without particularly specified, a serial successive steps for preparing the device comprising placing a substrate, forming a gate electrode, forming an insulator layer, forming an organic semiconductor layer, forming a source electrode and forming a drain electrode all without contacting with an atmosphere perfectly is preferable because it enables to prevent disturbance against the device performance caused by moisture or oxygen among the atmosphere in contact. In an occasion that any one of the above steps being unable to evade contacting with the atmosphere, it is desirable that a step of forming an organic semiconductor layer and all following steps never contact with the atmosphere and that the organic semiconductor layer should be laminated after cleaning and activating a surface over which the organic semiconductor layer is to be laminated, e.g., a surface over which a source electrode and a drain electrode were partially laminated in the case of the foregoing Device A, by means of ultraviolet irradiation, ultraviolet/ozone irradiation, oxygen plasma, argon plasma, etc., just before forming the organic semiconductor layer.

EXAMPLES

The present invention shall be explained below in further details with reference to examples, but the present invention shall by no means be restricted by the following examples.

Example 1

An organic thin film transistor was prepared in accordance with following steps. At first, a surface of a Si substrate (P-type; resistivity: 1 Ωcm; common use with a gate electrode) was oxidized in accordance with a thermal oxidation process, forming a thermal oxidation film having a thickness of 400 nm over the substrate and as a result, an insulator layer was provided. Further, after completely removing a $SiO_2$ film formed over another surface of the substrate by means of dry etching, a chromium film with a thickness of 20 nm was formed in accordance with a sputtering process, and further, a gold (Au) film with a thickness of 100 nm was formed in accordance with a sputtering process, resultantly taking out the films as an electrode. Subsequently, a source electrode and a drain electrode separated with a distance (channel length: L) of 100 μm between each other without contacting each other were provided over the insulator film by forming a gold film having a thickness of 150 nm through metal masking. Widths (channel widths Ws) of both the source electrode and the drain electrode were formed so as to be 4 mm respectively. Further subsequently, the foregoing Compound (1) was formed into an organic semiconductor layer having a film thickness of 150 nm in accordance with vacuum vapor deposition process through another metal masking and as a result, an organic thin film transistor was prepared (refer to FIG. 7).

Figure 7:
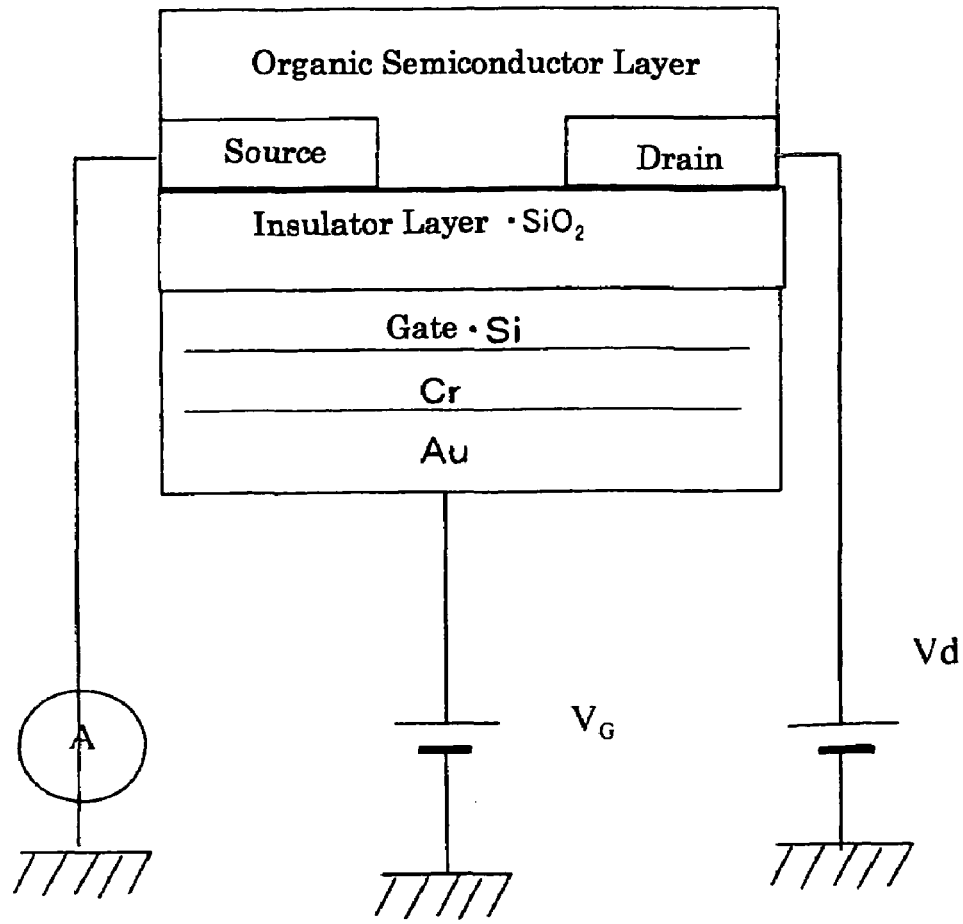
FIG. 7 is a drawing which illustrates a device structure of an organic thin film transistor in Example 1 of the present invention and a circuit structure employing the transistor.
Figure 8:
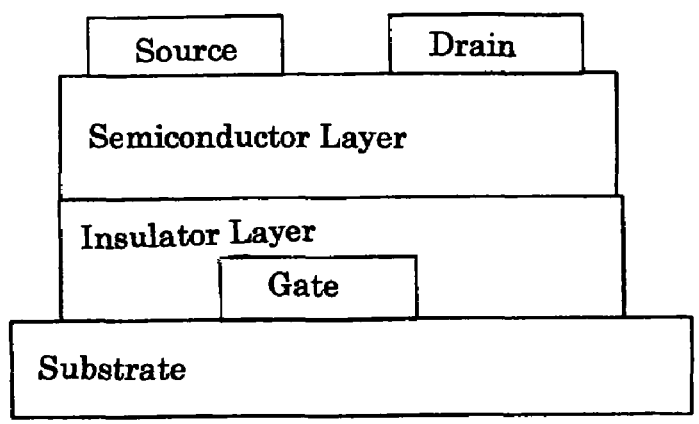
FIG. 8 is a drawing which illustrates one embodiment of a device structure of a typical conventional transistor.

Such a circuit structure as shown in FIG. 7 was provided with a use of the above organic thin film transistor, a gate voltage $V_G$ of +40 V was applied and at the same time, a voltage $V_d$ was applied between the source and the drain resultantly feeding an electric current. In this situation, electrons are induced within a channel region (between the source electrode and the drain electrode) of the organic semiconductor layer, and the thin film transistor works as a n-type transistor. As a result, the On-Off ratio of the electric current between the source electrode and the drain electrode within an electric current saturation region was $1.2 \times 10^8$. Further, a field-effect mobility μ of electrons was calculated by a following equation (A) and as a result, it was $6.3 \times 10^{-2}$ cm²/Vs.

$$I_D = (W/2L) \cdot C\mu(V_G - V_T)^2 \quad (A)$$

In the equation (A), $I_D$ represents an electric current between the source electrode and the drain electrode, W represents a channel width, L represents a channel length, C represents an electric capacitance per unit area of the gate insulator layer, $V_T$ represents a gate threshold voltage, and $V_G$ represents a gate voltage.

Examples 2 to 89

Organic thin film transistors were prepared in similar manners as Example 1 except that compounds described in Table 1 were employed instead of Compound (1). Regarding with the prepared organic thin film transistors, On-Off ratios of the electric current between the source electrode and the drain electrode were measured under the gate voltage $V_G$ of +40 V in the same manner as Example 1, together with calculating field-effect mobility μ of electrons. The results are shown in Table 1.

TABLE 1

| Example | Compound Number | Field-effect mobility μ of electrons (cm²/Vs) | On-Off ratio |
|---|---|---|---|
| 2 | 5 | $6.3 \times 10^{-2}$ | $1.2 \times 10^8$ |
| 3 | 10 | $7.5 \times 10^{-2}$ | $8.5 \times 10^7$ |
| 4 | 11 | $9.8 \times 10^{-3}$ | $1.8 \times 10^8$ |
| 5 | 14 | $9.5 \times 10^{-3}$ | $9.8 \times 10^6$ |
| 6 | 16 | $1.7 \times 10^{-2}$ | $3.7 \times 10^7$ |
| 7 | 21 | $8.5 \times 10^{-2}$ | $3.5 \times 10^7$ |
| 8 | 31 | $9.4 \times 10^{-3}$ | $2.5 \times 10^7$ |
| 9 | 40 | $9.8 \times 10^{-3}$ | $5.8 \times 10^8$ |
| 10 | 46 | $2.3 \times 10^{-2}$ | $7.6 \times 10^6$ |
| 11 | 51 | $8.3 \times 10^{-2}$ | $6.6 \times 10^6$ |
| 12 | 59 | $3.9 \times 10^{-3}$ | $3.2 \times 10^8$ |
| 13 | 67 | $9.8 \times 10^{-3}$ | $2.5 \times 10^7$ |
| 14 | 76 | $7.2 \times 10^{-2}$ | $1.9 \times 10^9$ |
| 15 | 83 | $8.0 \times 10^{-2}$ | $9.8 \times 10^6$ |
| 16 | 97 | $5.8 \times 10^{-3}$ | $3.7 \times 10^6$ |
| 17 | 106 | $4.5 \times 10^{-3}$ | $1.2 \times 10^7$ |
| 18 | 107 | $4.2 \times 10^{-2}$ | $2.5 \times 10^7$ |
| 19 | 111 | $8.3 \times 10^{-2}$ | $1.8 \times 10^8$ |
| 20 | 112 | $9.4 \times 10^{-3}$ | $7.2 \times 10^6$ |
| 21 | 113 | $9.9 \times 10^{-3}$ | $3.8 \times 10^7$ |
| 22 | 114 | $2.4 \times 10^{-2}$ | $2.7 \times 10^7$ |
| 23 | 115 | $8.0 \times 10^{-2}$ | $2.6 \times 10^7$ |
| 24 | 116 | $2.7 \times 10^{-3}$ | $6.8 \times 10^7$ |
| 25 | 117 | $5.8 \times 10^{-3}$ | $9.5 \times 10^6$ |
| 26 | 118 | $3.5 \times 10^{-2}$ | $8.7 \times 10^6$ |
| 27 | 119 | $8.3 \times 10^{-2}$ | $3.4 \times 10^8$ |
| 28 | 120 | $7.8 \times 10^{-3}$ | $2.6 \times 10^7$ |
| 29 | 121 | $7.9 \times 10^{-3}$ | $1.0 \times 10^8$ |
| 30 | 122 | $1.7 \times 10^{-2}$ | $6.8 \times 10^6$ |
| 31 | 123 | $4.5 \times 10^{-2}$ | $6.5 \times 10^6$ |
| 32 | 124 | $4.9 \times 10^{-3}$ | $7.8 \times 10^6$ |
| 33 | 125 | $9.5 \times 10^{-3}$ | $2.5 \times 10^7$ |
| 34 | 126 | $5.6 \times 10^{-2}$ | $5.8 \times 10^7$ |
| 35 | 127 | $8.3 \times 10^{-2}$ | $3.5 \times 10^6$ |
| 36 | 136 | $7.6 \times 10^{-3}$ | $4.7 \times 10^6$ |
| 37 | 145 | $6.6 \times 10^{-3}$ | $1.2 \times 10^8$ |
| 38 | 148 | $8.7 \times 10^{-2}$ | $3.6 \times 10^7$ |
| 39 | 149 | $8.3 \times 10^{-2}$ | $1.4 \times 10^8$ |
| 40 | 151 | $6.4 \times 10^{-3}$ | $3.8 \times 10^7$ |
| 41 | 152 | $6.8 \times 10^{-3}$ | $8.5 \times 10^7$ |
| 42 | 165 | $1.2 \times 10^{-2}$ | $4.8 \times 10^6$ |
| 43 | 167 | $8.3 \times 10^{-2}$ | $2.5 \times 10^7$ |
| 44 | 170 | $6.1 \times 10^{-3}$ | $8.5 \times 10^6$ |
| 45 | 171 | $9.8 \times 10^{-3}$ | $3.7 \times 10^7$ |
| 46 | 172 | $4.6 \times 10^{-2}$ | $3.2 \times 10^7$ |
| 47 | 183 | $8.3 \times 10^{-2}$ | $5.5 \times 10^7$ |
| 48 | 188 | $2.8 \times 10^{-3}$ | $5.6 \times 10^7$ |
| 49 | 193 | $6.8 \times 10^{-3}$ | $9.8 \times 10^6$ |
| 50 | 198 | $5.2 \times 10^{-2}$ | $3.7 \times 10^7$ |
| 51 | 208 | $8.0 \times 10^{-2}$ | $6.5 \times 10^7$ |
| 52 | 212 | $1.0 \times 10^{-3}$ | $6.5 \times 10^7$ |
| 53 | 215 | $9.8 \times 10^{-3}$ | $5.6 \times 10^8$ |
| 54 | 216 | $5.0 \times 10^{-2}$ | $6.6 \times 10^6$ |
| 55 | 217 | $8.5 \times 10^{-2}$ | $6.6 \times 10^6$ |
| 56 | 218 | $1.9 \times 10^{-3}$ | $3.7 \times 10^7$ |
| 57 | 228 | $9.8 \times 10^{-3}$ | $1.5 \times 10^7$ |
| 58 | 229 | $1.7 \times 10^{-2}$ | $1.4 \times 10^8$ |
| 59 | 230 | $8.5 \times 10^{-2}$ | $9.4 \times 10^7$ |
| 60 | 232 | $4.8 \times 10^{-3}$ | $5.6 \times 10^6$ |
| 61 | 233 | $9.8 \times 10^{-3}$ | $7.6 \times 10^7$ |
| 62 | 234 | $1.2 \times 10^{-2}$ | $2.5 \times 10^7$ |
| 63 | 236 | $8.4 \times 10^{-2}$ | $1.6 \times 10^8$ |
| 64 | 237 | $1.7 \times 10^{-3}$ | $6.1 \times 10^6$ |
| 65 | 238 | $9.9 \times 10^{-3}$ | $3.7 \times 10^7$ |
| 66 | 245 | $6.7 \times 10^{-2}$ | $6.5 \times 10^7$ |

TABLE 1-continued

| Example | Compound Number | Field-effect mobility μ of electrons (cm$^2$/Vs) | On-Off ratio |
|---|---|---|---|
| 67 | 248 | 8.0 × 10$^{-2}$ | 2.6 × 10$^7$ |
| 68 | 253 | 7.7 × 10$^{-3}$ | 4.4 × 10$^7$ |
| 69 | 255 | 5.8 × 10$^{-3}$ | 8.2 × 10$^6$ |
| 70 | 265 | 2.9 × 10$^{-2}$ | 5.7 × 10$^6$ |
| 71 | 267 | 6.3 × 10$^{-2}$ | 2.2 × 10$^8$ |
| 72 | 268 | 4.8 × 10$^{-3}$ | 2.4 × 10$^7$ |
| 73 | 272 | 6.8 × 10$^{-3}$ | 1.1 × 10$^8$ |
| 74 | 273 | 6.2 × 10$^{-2}$ | 6.1 × 10$^6$ |
| 75 | 277 | 7.5 × 10$^{-2}$ | 5.5 × 10$^6$ |
| 76 | 281 | 6.8 × 10$^{-3}$ | 7.8 × 10$^6$ |
| 77 | 298 | 5.8 × 10$^{-3}$ | 5.5 × 10$^7$ |
| 78 | 299 | 5.2 × 10$^{-2}$ | 5.4 × 10$^7$ |
| 79 | 300 | 4.5 × 10$^{-2}$ | 9.5 × 10$^6$ |
| 80 | 308 | 3.5 × 10$^{-3}$ | 9.7 × 10$^6$ |
| 81 | 309 | 9.4 × 10$^{-3}$ | 2.6 × 10$^8$ |
| 82 | 315 | 1.3 × 10$^{-2}$ | 3.7 × 10$^7$ |
| 83 | 323 | 8.6 × 10$^{-2}$ | 1.7 × 10$^8$ |
| 84 | 318 | 9.8 × 10$^{-3}$ | 3.9 × 10$^7$ |
| 85 | 326 | 9.8 × 10$^{-3}$ | 8.5 × 10$^7$ |
| 86 | 327 | 6.2 × 10$^{-2}$ | 8.8 × 10$^6$ |
| 87 | 328 | 6.5 × 10$^{-2}$ | 2.8 × 10$^7$ |
| 88 | 329 | 5.8 × 10$^{-3}$ | 9.5 × 10$^6$ |
| 89 | 331 | 8.8 × 10$^{-3}$ | 3.8 × 10$^7$ |

A chromium film having a thickness of 100 nm was formed in accordance with a vacuum vapor deposition process over a glass substrate having a thickness of 1 mm, and the film was named as a gate electrode. Subsequently, an insulator layer of SiO$_2$ having a film thickness of 300 nm was formed in accordance with a sputtering process over the gate electrode. Subsequently, a source electrode and a drain electrode separated with a distance (channel length: L) of 100 μm between each other without contacting each other and having widths (channel widths: W8) of 4 mm were provided over the insulator film by forming gold (Au) films having thicknesses of 150 nm through metal masking. Further subsequently, the foregoing Compound (77) was formed into an organic semiconductor layer having a film thickness of 150 nm in accordance with vacuum vapor deposition process through another metal masking and as a result, an organic thin film transistor was prepared (refer to FIG. 1).

The same circuit structure as in Example 1 was provided with a use of the above organic thin film transistor, a gate voltage V$_G$ of +40 V was applied and at the same time, a voltage V$_d$ was applied between the source and the drain resultantly feeding an electric current. As a result, the On-Off ratio of the electric current between the source electrode and the drain electrode within an electric current saturation region was 3.1×10$^8$. Further, a field-effect mobility μ of electrons was calculated and as a result, it was 6.9×10$^{-3}$ cm$^2$/Vs.

Example 91

A source electrode and a drain electrode separated with a distance (channel length: L) of 100 μm between each other without contacting each other and having widths (channel widths: Ws) of 4 mm were provided over a glass substrate having a thickness of 1 mm by forming gold (Au) films having thicknesses of 150 nm through metal masking. Subsequently, the foregoing Compound (149) was formed into an organic semiconductor layer having a film thickness of 150 nm in accordance with vacuum vapor deposition process through another metal masking and then, an insulator layer of aluminum oxide (Al$_2$O$_3$) having a film thickness of 200 nm was formed in accordance with a sputtering process over the semiconductor layer. Finally, sputtering a gate electrode (Al) through another masking, an organic thin film transistor was prepared (refer to FIG. 3).

The same circuit structure as in Example 1 was provided with a use of the above organic thin film transistor, a gate voltage V$_G$ of +40 V was applied and at the same time, a voltage V$_d$ was applied between the source and the drain resultantly feeding an electric current. As a result, the On-Off ratio of the electric current between the source electrode and the drain electrode within an electric current saturation region was 3.8×10$^8$. Further, a field-effect mobility μ of electrons was calculated and as a result, it was 2.1×10$^{-2}$ cm$^2$/Vs.

Example 92

A polyethylene terephthalate film having a thickness of 200 μm was used as a substrate. Dissolving 3% by weight of the foregoing Compound (309) into toluene, the resultant solution was film-formed over the substrate in accordance with a spin coating process, followed by drying at the temperature of 120° C. under an atmosphere of nitrogen gas. Subsequently, a source electrode and a drain electrode separated with a distance (channel length: L) of 100 μm between each other without contacting each other and having widths (channel widths: Ws) of 4 mm were provided over the above film by forming gold (Au) films having thicknesses of 150 nm through metal masking with a use of vacuum vapor deposition apparatus. Further, polyethylene was vapor deposited in accordance with vacuum vapor deposition process to form an insulator layer. Over the insulator layer, aluminum was vacuum vapor deposited to form a gate electrode (refer to FIG. 4).

The same circuit structure as in Example 1 was provided with a use of the above organic thin film transistor, a gate voltage V$_G$ of +40 V was applied and at the same time, a voltage V$_d$ was applied between the source and the drain resultantly feeding an electric current. As a result; the On-Off ratio of the electric current between the source electrode and the drain electrode within an electric current saturation region was 4.3×10$^6$. Further, a field-effect mobility A of electrons was calculated and as a result, it was 8.6×10$^{-4}$ cm$^2$/Vs.

Comparative Example 1

An organic thin film transistor was prepared in the same manner as Example 1 except that hexadecafluorocopper phthalocyaninate (F$_{16}$PcCu) was used instead of Compound (1) (refer to FIG. 7).

The same circuit structure as in Example 1 was provided with a use of the above organic thin film transistor, a gate voltage V$_G$ of +40 V was applied and at the same time, a voltage V$_d$ was applied between the source and the drain resultantly feeding an electric current. As a result, the On-Off ratio of the electric current between the source electrode and the drain electrode within an electric current saturation region was 1.2×10$^3$. Further, a field-effect mobility u of electrons was calculated and as a result, it was 1.3×10$^3$ cm$^2$/Vs.

INDUSTRIAL APPLICABILITY

Employing a heterocyclic compound containing a nitrogen atom with a specified structure as a material for an organic semiconductor layer in it, the organic thin film transistor of the present invention became to have a fast response speed (driving speed), and further, achieved a large On-Off ratio getting an enhanced performance as a transistor.

What is claimed is:

1. An organic thin film transistor comprising:
   at least three terminals comprising a gate electrode, a source electrode and a drain electrode; and
   an insulating layer and an organic semiconductor layer on a substrate, which controls an electric current flowing between the source electrode and the drain electrode by applying an electric voltage across the gate electrode, a distance between the source electrode and the drain electrode being 1 μm to 1 mm;
   wherein the organic semiconductor layer comprises a heterocyclic compound containing a nitrogen atom expressed by formula (II):

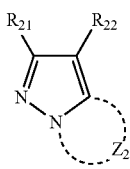

(II)

wherein $R_{21}$ and $R_{22}$ each independently represents a hydrogen atom or a substituent; and
   $Z_2$ represents an atomic group forming a five-member ring or a six-member ring;
   wherein the substituents represented by $R_{21}$ and $R_{22}$ are each independently selected from the group consisting of an alkyl group having 1 to 40 carbon atoms, an alkenyl group having 2 to 8 carbon atoms, an alkynyl group having 2 to 8 carbon atoms, an aryl group having 6 to 40 carbon atoms, an amino group having 0 to 6 carbon atoms, an alkoxyl group having 1 to 8 carbon atoms, an aryloxy group having 6 to 12 carbon atoms, an acyl group having 1 to 12 carbon atoms, an alkoxycarbonyl group having 2 to 12 carbon atoms, an aryloxycarbonyl group having 7 to 10 carbon atoms, an acyloxy group having 2 to 10 carbon atoms, an acylamino group having 2 to 10 carbon atoms, an alkoxycarbonylamino group having 2 to 12 carbon atoms, an aryloxycarbonyl-amino group having 7 to 12 carbon atoms, a sulfonylamino group having 1 to 12 carbon atoms, a sulfamoyl group having 0 to 12 carbon atoms, a carbamoyl group having 1 to 12 carbon atoms, an alkylthio group having 1 to 12 carbon atoms, an arylthio group having 6 to 20 carbon atoms, a sulphonyl group having 1 to 12 carbon atoms, a sulfinyl group having 1 to 12 carbon atoms, an ureide group having 1 to 12 carbon atoms, a phosphoric amide group having 1 to 12 carbon atoms, a hydroxy group, a mercapto group, a halogen atom, a cyano group, a sulfo group, a carboxyl group, a nitro group, a hydroxamic acid group, a surufino group, a hydrazino group, an imino group, and a heterocycle group having 1 to 12 carbon atoms; and
   said substituents are each independently unsubstituted or further substituted with an alkyl group, an alkenyl group, an aralkyl group, an aryl group, an acyl group, an alkoxyl group, an aryloxy group, an acyloxy group, an alkoxycarbonyl group, an aryloxycarbonyl group, a carbonylamino group, a sulfonyl amino group, a sulfamoyl group, a carbamoyl group, a cyano group, a halogen atom, a hydroxy group or a heterocyclic group.

2. The organic thin film transistor according to claim 1, wherein the distance between the source electrode and the drain electrode is 5 μm to 1 mm.

3. The organic thin film transistor according to claim 1, wherein the source electrode and the drain electrode are formed on the insulating layer.

4. The organic thin film transistor according to claim 1, wherein the source electrode and the drain electrode are formed on the organic semiconductor layer.

5. The organic thin film transistor according to claim 1, wherein the source electrode and the drain electrode are formed on the substrate.

6. The organic thin film transistor according to claim 1, wherein the source electrode and the drain electrode are juxtaposed on the substrate.

7. The organic thin film transistor according to claim 1, wherein the source electrode and the drain electrode are formed in contact with a same plane.

8. The organic thin film transistor according to claim 1, comprising a device structure selected from the group consisting of:
   (A) the gate electrode, the insulating layer, a pair of the source electrode and the drain electrode and the organic semiconductor layer formed on the substrate in said order;
   (B) the gate electrode, the insulating layer, the organic semiconductor layer and a pair of the source electrode and the drain electrode formed on the substrate in said order;
   (C) a pair of the source electrode and the drain electrode, the organic semiconductor layer, the insulating layer and the gate electrode formed on the substrate in said order; and
   (D) the organic semiconductor layer, a pair of the source electrode and the drain electrode, the insulating layer and the gate electrode formed on the substrate in said order.

9. The organic thin film transistor according to claim 1, wherein the source electrode and the drain electrode are in contact with the organic semiconductor layer.

10. An organic thin film transistor comprising:
   at least three terminals comprising a gate electrode, a source electrode and a drain electrode; and
   an insulating layer and an organic semiconductor layer on a substrate, which controls an electric current flowing between the source electrode and the drain electrode by applying an electric voltage across the gate electrode, a distance between the source electrode and the drain electrode being 1 μm to 1 mm;
   wherein the organic semiconductor layer comprises a heterocyclic compound containing a nitrogen atom expressed by formula (III):

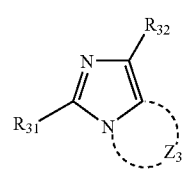

(III)

wherein $R_{31}$ and $R_{32}$ each independently represents a hydrogen atom or a substituent; and
   $Z_3$ represents an atomic group forming a five-member ring or a six-member ring;
   wherein the substituents represented by $R_{31}$ and $R_{32}$ are each independently selected from the group consisting of an alkyl group having 1 to 40 carbon atoms, an alkenyl group having 2 to 8 carbon atoms, an alkynyl group having 2 to 8 carbon atoms, an aryl group having 6 to 40 carbon atoms, an amino group having 0 to 6 carbon atoms, an alkoxyl group having 1 to 8 carbon atoms, an aryloxy group having 6 to 12 carbon atoms, an acyl group having 1 to 12 carbon atoms, an alkoxycarbonyl group having 2 to 12 carbon atoms, an aryloxycarbonyl group having 7 to 10 carbon atoms, an acyloxy group having 2 to 10 carbon atoms, an acylamino group having 2 to 10 carbon atoms, an alkoxycarbonylamino group having 2 to 12 carbon atoms, an aryloxycarbonyl-amino group having 7 to 12 carbon atoms, a sulfonylamino group having 1 to 12 carbon atoms, a sulfamoyl group having 0 to 12 carbon atoms, a carbamoyl group having 1 to 12 carbon atoms, an alkylthio group having 1 to 12 carbon atoms, an arylthio group having 6 to 20 carbon atoms, a suiphonyl group having 1 to 12 carbon atoms, a sulfinyl group having 1 to 12 carbon atoms, an ureide group having 1 to 12 carbon atoms, a phosphoric amide group having 1 to 12 carbon atoms, a hydroxy group, a mercapto group, a halogen atom, a cyano group, a sulfo group, a carboxyl group, a nitro group, a hydroxamic acid group, a surufino group, a hydrazino group, an imino group, and a heterocycle group having 1 to 12 carbon atoms; and said substituents are each independently unsubstituted or further substituted with an alkyl group, an alkenyl group, an aralkyl group, an aryl group, an acyl group, an alkoxyl group, an aryloxy group, an acyloxy group, an alkoxycarbonyl group, an aryloxycarbonyl group, a carbonylamino group, a sulfonyl amino group, a sulfamoyl group, a carbamoyl group, a cyano group, a halogen atom, a hydroxy group or a heterocyclic group.

11. The organic thin film transistor according to claim 10, wherein the distance between the source electrode and the drain electrode is 5 μm to 1 mm.

12. The organic thin film transistor according to claim 10, wherein the source electrode and the drain electrode are formed on the insulating layer.

13. The organic thin film transistor according to claim 10, wherein the source electrode and the drain electrode are formed on the organic semiconductor layer.

14. The organic thin film transistor according to claim 10, wherein the source electrode and the drain electrode are formed on the substrate.

15. The organic thin film transistor according to claim 10, wherein the source electrode and the drain electrode are juxtaposed on the substrate.

16. The organic thin film transistor according to claim 10, wherein the source electrode and the drain electrode are formed in contact with a same plane.

17. The organic thin film transistor according to claim 10, comprising a device structure selected from the group comprising:

(A) the gate electrode, the insulating layer, a pair of the source electrode and the drain electrode and the organic semiconductor layer formed on the substrate in said order;

(B) the gate electrode, the insulating layer, the organic semiconductor layer and a pair of the source electrode and the drain electrode formed on the substrate in said order;

(C) a pair of the source electrode and the drain electrode, the organic semiconductor layer, the insulating layer and the gate electrode formed on the substrate in said order; and (D) the organic semiconductor layer, a pair of the source electrode and the drain electrode, the insulating layer and the gate electrode formed on the substrate in said order.

18. The organic thin film transistor according to claim 10, wherein the source electrode and the drain electrode are in contact with the organic semiconductor layer.

19. An organic thin film transistor comprising:

at least three terminals comprising a gate electrode, a source electrode and a drain electrode; and an insulating layer and an organic semiconductor layer on a substrate, which controls an electric current flowing between the source electrode and the drain electrode by applying an electric voltage across the gate electrode, a distance between the source electrode and the drain electrode being 1 μm to 1 mm;

wherein the organic semiconductor layer comprises a heterocyclic compound containing a nitrogen atom expressed by formula (V):

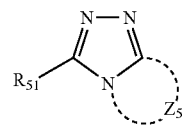

(V)

wherein $R_{51}$ represents a hydrogen atom or a substituent; and $Z_5$ represents an atomic group forming a five-member ring or a six-member ring;

wherein the substituent represented by $R_{51}$ is selected from the group consisting of an alkyl group having 1 to 40 carbon atoms, an alkenyl group having 2 to 8 carbon atoms, an alkynyl group having 2 to 8 carbon atoms, an aryl group having 6 to 40 carbon atoms, an amino group having 0 to 6 carbon atoms, an alkoxyl group having 1 to 8 carbon atoms, an aryloxy group having 6 to 12 carbon atoms, an acyl group having 1 to 12 carbon atoms, an alkoxycarbonyl group having 2 to 12 carbon atoms, an aryloxycarbonyl group having 7 to 10 carbon atoms, an acyloxy group having 2 to 10 carbon atoms, an acylamino group having 2 to 10 carbon atoms, an alkoxycarbonylamino group having 2 to 12 carbon atoms, an aryloxycarbonyl-amino group having 7 to 12 carbon atoms, a sulfonylamino group having 1 to 12 carbon atoms, a sulfamoyl group having 0 to 12 carbon atoms, a carbamoyl group having 1 to 12 carbon atoms, an alkylthio group having 1 to 12 carbon atoms, an arylthio group having 6 to 20 carbon atoms, a sulphonyl group having 1 to 12 carbon atoms, a sulfinyl group having 1 to 12 carbon atoms, an ureide group having 1 to 12 carbon atoms, a phosphoric amide group having 1 to 12 carbon atoms, a hydroxy group, a mercapto group, a halogen atom, a cyano group, a sulfo group, a carboxyl group, a nitro group, a hydroxamic acid group, a surufino group, a hydrazino group, an imino group, and a heterocycle group having 1 to 12 carbon atoms; and said substituent is unsubstituted or further substituted with an alkyl group, an alkenyl group, an aralkyl group, an aryl group, an acyl group, an alkoxyl group, an aryloxy group, an acyloxy group, an alkoxycarbonyl group, an aryloxycarbonyl group, a carbonylamino group, a sulfonyl amino group, a sulfamoyl group, a carbamoyl group, a cyano group, a halogen atom, a hydroxy group or a heterocyclic group.

20. The organic thin film transistor according to claim 19, wherein the distance between the source electrode and the drain electrode is 5 µm to 1 mm.

21. The organic thin film transistor according to claim 19, wherein the source electrode and the drain electrode are formed on the insulating layer.

22. The organic thin film transistor according to claim 19, wherein the source electrode and the drain electrode are formed on the organic semiconductor layer.

23. The organic thin film transistor according to claim 19, wherein the source electrode and the drain electrode are formed on the substrate.

24. The organic thin film transistor according to claim 19, wherein the source electrode and the drain electrode are juxtaposed on the substrate.

25. The organic thin film transistor according to claim 19, wherein the source electrode and the drain electrode are formed in contact with a same plane.

26. The organic thin film transistor according to claim 19, comprising a device structure selected from the group consisting of:
(A) the gate electrode, the insulating layer, a pair of the source electrode and the drain electrode and the organic semiconductor layer formed on the substrate in said order;
(B) the gate electrode, the insulating layer, the organic semiconductor layer and a pair of the source electrode and the drain electrode formed on the substrate in said order;
(C) a pair of the source electrode and the drain electrode, the organic semiconductor layer, the insulating layer and the gate electrode formed on the substrate in said order; and
(D) the organic semiconductor layer, a pair of the source electrode and the drain electrode, the insulating layer and the gate electrode formed on the substrate in said order.

27. The organic thin film transistor according to claim 19, wherein the source electrode and the drain electrode are in contact with the organic semiconductor layer.

28. An organic thin film transistor comprising:
at least three terminals comprising a gate electrode, a source electrode and a drain electrode; and
an insulating layer and an organic semiconductor layer on a substrate, which controls an electric current flowing between the source electrode and the drain electrode by applying an electric voltage across the gate electrode, a distance between the source electrode and the drain electrode being 1 µm to 1 mm;
wherein the organic semiconductor layer comprises a heterocyclic compound containing a nitrogen atom expressed by formula (VI):

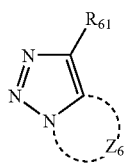

(VI)

wherein $R_{61}$ represents a hydrogen atom or a substituent; and
$Z_6$ represents an atomic group forming a five-member ring or a six-member ring;

wherein the substituent represented by $R_{61}$ is selected from the group consisting of an alkyl group having 1 to 40 carbon atoms, an alkenyl group having 2 to 8 carbon atoms, an alkynyl group having 2 to 8 carbon atoms, an aryl group having 6 to 40 carbon atoms, an amino group having 0 to 6 carbon atoms, an alkoxyl group having 1 to 8 carbon atoms, an aryloxy group having 6 to 12 carbon atoms, an acyl group having 1 to 12 carbon atoms, an alkoxycarbonyl group having 2 to 12 carbon atoms, an aryloxycarbonyl group having 7 to 10 carbon atoms, an acyloxy group having 2 to 10 carbon atoms, an acylamino group having 2 to 10 carbon atoms, an alkoxycarbonylamino group having 2 to 12 carbon atoms, an aryloxycarbonyl-amino group having 7 to 12 carbon atoms, a sulfonylamino group having 1 to 12 carbon atoms, a sulfamoyl group having 0 to 12 carbon atoms, a carbamoyl group having 1 to 12 carbon atoms, an alkylthio group having 1 to 12 carbon atoms, an arylthio group having 6 to 20 carbon atoms, a sulphonyl group having 1 to 12 carbon atoms, a sulfinyl group having 1 to 12 carbon atoms, an ureide group having 1 to 12 carbon atoms, a phosphoric amide group having 1 to 12 carbon atoms, a hydroxy group, a mercapto group, a halogen atom, a cyano group, a sulfo group, a carboxyl group, a nitro group, a hydroxamic acid group, a surufino group, a hydrazino group, an imino group, and a heterocycle group having 1 to 12 carbon atoms; and
said substituent is unsubstituted or further substituted with an alkyl group, an alkenyl group, an aralkyl group, an aryl group, an acyl group, an alkoxyl group, an aryloxy group, an acyloxy group, an alkoxycarbonyl group, an aryloxycarbonyl group, a carbonylamino group, a sulfonyl amino group, a sulfamoyl group, a carbamoyl group, a cyano group, a halogen atom, a hydroxy group or a heterocyclic group.

29. The organic thin film transistor according to claim 28, wherein the distance between the source electrode and the drain electrode is 5 µm to 1 mm.

30. The organic thin film transistor according to claim 28, wherein the source electrode and the drain electrode are formed on the insulating layer.

31. The organic thin film transistor according to claim 28, wherein the source electrode and the drain electrode are formed on the organic semiconductor layer.

32. The organic thin film transistor according to claim 28, wherein the source electrode and the drain electrode are formed on the substrate.

33. The organic thin film transistor according to claim 28, wherein the source electrode and the drain electrode are juxtaposed on the substrate.

34. The organic thin film transistor according to claim 28, wherein the source electrode and the drain electrode are formed in contact with a same plane.

35. The organic thin film transistor according to claim 28, comprising a device structure selected from the group consisting of:
(A) the gate electrode, the insulating layer, a pair of the source electrode and the drain electrode and the organic semiconductor layer formed on the substrate in said order;
(B) the gate electrode, the insulating layer, the organic semiconductor layer and a pair of the source electrode and the drain electrode formed on the substrate in said order;

(C) a pair of the source electrode and the drain electrode, the organic semiconductor layer, the insulating layer and the gate electrode formed on the substrate in said order; and (D) the organic semiconductor layer, a pair of the source electrode and the drain electrode, the insulating layer and the gate electrode formed on the substrate in said order.

36. The organic thin film transistor according to claim 28, wherein the source electrode and the drain electrode are in contact with the organic semiconductor layer.

37. An organic thin film transistor comprising:
   at least three terminals comprising a gate electrode, a source electrode and a drain electrode; and
   an insulating layer and an organic semiconductor layer on a substrate, which controls an electric current flowing between the source electrode and the drain electrode by applying an electric voltage across the gate electrode, a distance between the source electrode and the drain electrode being 1 μm to 1 mm;
   wherein the organic semiconductor layer comprises a heterocyclic compound containing a nitrogen atom is a expressed by formula (VII):

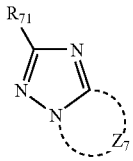

(VII)

wherein $R_{71}$ represents a hydrogen atom or a substituent; and
   $Z_7$ represents a group forming a five-member ring or a six-member ring;
   wherein the substituent represented by $R_{71}$ is selected from the group consisting of an alkyl group having 1 to 40 carbon atoms, an alkenyl group having 2 to 8 carbon atoms, an alkynyl group having 2 to 8 carbon atoms, an aryl group having 6 to 40 carbon atoms, an amino group having 0 to 6 carbon atoms, an alkoxyl group having 1 to 8 carbon atoms, an aryloxy group having 6 to 12 carbon atoms, an acyl group having 1 to 12 carbon atoms, an alkoxycarbonyl group having 2 to 12 carbon atoms, an aryloxycarbonyl group having 7 to 10 carbon atoms, an acyloxy group having 2 to 10 carbon atoms, an acylamino group having 2 to 10 carbon atoms, an alkoxycarbonylamino group having 2 to 12 carbon atoms, an aryloxycarbonyl-amino group having 7 to 12 carbon atoms, a sulfonylamino group having 1 to 12 carbon atoms, a sulfamoyl group having 0 to 12 carbon atoms, a carbamoyl group having 1 to 12 carbon atoms, an alkylthio group having 1 to 12 carbon atoms, an arylthio group having 6 to 20 carbon atoms, a sulphonyl group having 1 to 12 carbon atoms, a sulfinyl group having 1 to 12 carbon atoms, an ureide group having 1 to 12 carbon atoms, a phosphoric amide group having 1 to 12 carbon atoms, a hydroxy group, a mercapto group, a halogen atom, a cyano group, a sulfo group, a carboxyl group, a nitro group, a hydroxamic acid group, a surufino group, a hydrazino group, an imino group, and a heterocycle group having 1 to 12 carbon atoms; and said substituent is unsubstituted or further substituted with an alkyl group, an alkenyl group, an aralkyl group, an aryl group, an acyl group, an alkoxyl group, an aryloxy group, an acyloxy group, an alkoxycarbonyl group, an aryloxycarbonyl group, a carbonylamino group, a sulfonyl amino group, a sulfamoyl group, a carbamoyl group, a cyano group, a halogen atom, a hydroxy group or a heterocyclic group.

38. The organic thin film transistor according to claim 37, wherein the distance between the source electrode and the drain electrode is 5 μm to 1 mm.

39. The organic thin film transistor according to claim 37, wherein the source electrode and the drain electrode are formed on the insulating layer.

40. The organic thin film transistor according to claim 37, wherein the source electrode and the drain electrode are formed on the organic semiconductor layer.

41. The organic thin film transistor according to claim 37, wherein the source electrode and the drain electrode are formed on the substrate.

42. The organic thin film transistor according to claim 37, wherein the source electrode and the drain electrode are juxtaposed on the substrate.

43. The organic thin film transistor according to claim 37, wherein the source electrode and the drain electrode are formed in contact with a same plane.

44. The organic thin film transistor according to claim 37, comprising a device structure selected from the group consisting of:
   (A) the gate electrode, the insulating layer, a pair of the source electrode and the drain electrode and the organic semiconductor layer formed on the substrate in said order;
   (B) the gate electrode, the insulating layer, the organic semiconductor layer and a pair of the source electrode and the drain electrode formed on the substrate in said order;
   (C) a pair of the source electrode and the drain electrode, the organic semiconductor layer, the insulating layer and the gate electrode formed on the substrate in said order; and
   (D) the organic semiconductor layer, a pair of the source electrode and the drain electrode, the insulating layer and the gate electrode formed on the substrate in said order.

45. The organic thin film transistor according to claim 37, wherein the source electrode and the drain electrode are in contact with the organic semiconductor layer.

* * * * *